United States Patent
Lin et al.

(10) Patent No.: US 12,079,152 B2
(45) Date of Patent: Sep. 3, 2024

(54) SYSTEMS AND METHODS OF TESTING MEMORY DEVICES

(71) Applicant: Taiwan Semiconductor Manufacturing Company, Ltd., Hsinchu (TW)

(72) Inventors: Meng-Han Lin, Hsinchu (TW); Chia-En Huang, Xinfeng Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 213 days.

(21) Appl. No.: 17/585,352

(22) Filed: Jan. 26, 2022

(65) Prior Publication Data

US 2023/0031011 A1 Feb. 2, 2023

Related U.S. Application Data

(60) Provisional application No. 63/226,970, filed on Jul. 29, 2021.

(51) Int. Cl.
*G11C 7/00* (2006.01)
*G06F 13/40* (2006.01)
*G11C 29/08* (2006.01)

(52) U.S. Cl.
CPC .......... *G06F 13/4027* (2013.01); *G11C 29/08* (2013.01)

(58) Field of Classification Search
CPC ....... G11C 29/50; G11C 11/401; G11C 29/02; G11C 29/34; H01K 999/99
USPC ........................................................ 365/201
See application file for complete search history.

(56) References Cited

U.S. PATENT DOCUMENTS

| 2004/0061110 A1* | 4/2004 | Felber ................. H10B 12/0385 |
| | | 257/E21.653 |
| 2019/0057756 A1* | 2/2019 | Kim ........................ H10B 41/27 |
| 2020/0020715 A1* | 1/2020 | Nakamura ............. H10B 43/10 |

* cited by examiner

*Primary Examiner* — Son T Dinh
(74) *Attorney, Agent, or Firm* — FOLEY & LARDNER LLP

(57) ABSTRACT

A memory device includes a first memory block. The first memory block includes a first memory sub-array and a first interface portion disposed next to the first memory sub-array. The first interface portion has a plurality of first control structures formed as a first staircase profile. The first memory block further includes a plurality of first interconnect structures landing on a corresponding one of the plurality of first control structures, and a plurality of second interconnect structures configured to electrically couple a corresponding one of the plurality of first interconnect structures to a first transistor. The memory device further includes a first test structure and a second test structure disposed next to the first memory block, each configured to simulate electrical connections of the plurality of second interconnect structures. The first and second test structures are electrically coupled to each other and are electrically isolated form the first memory block.

20 Claims, 30 Drawing Sheets

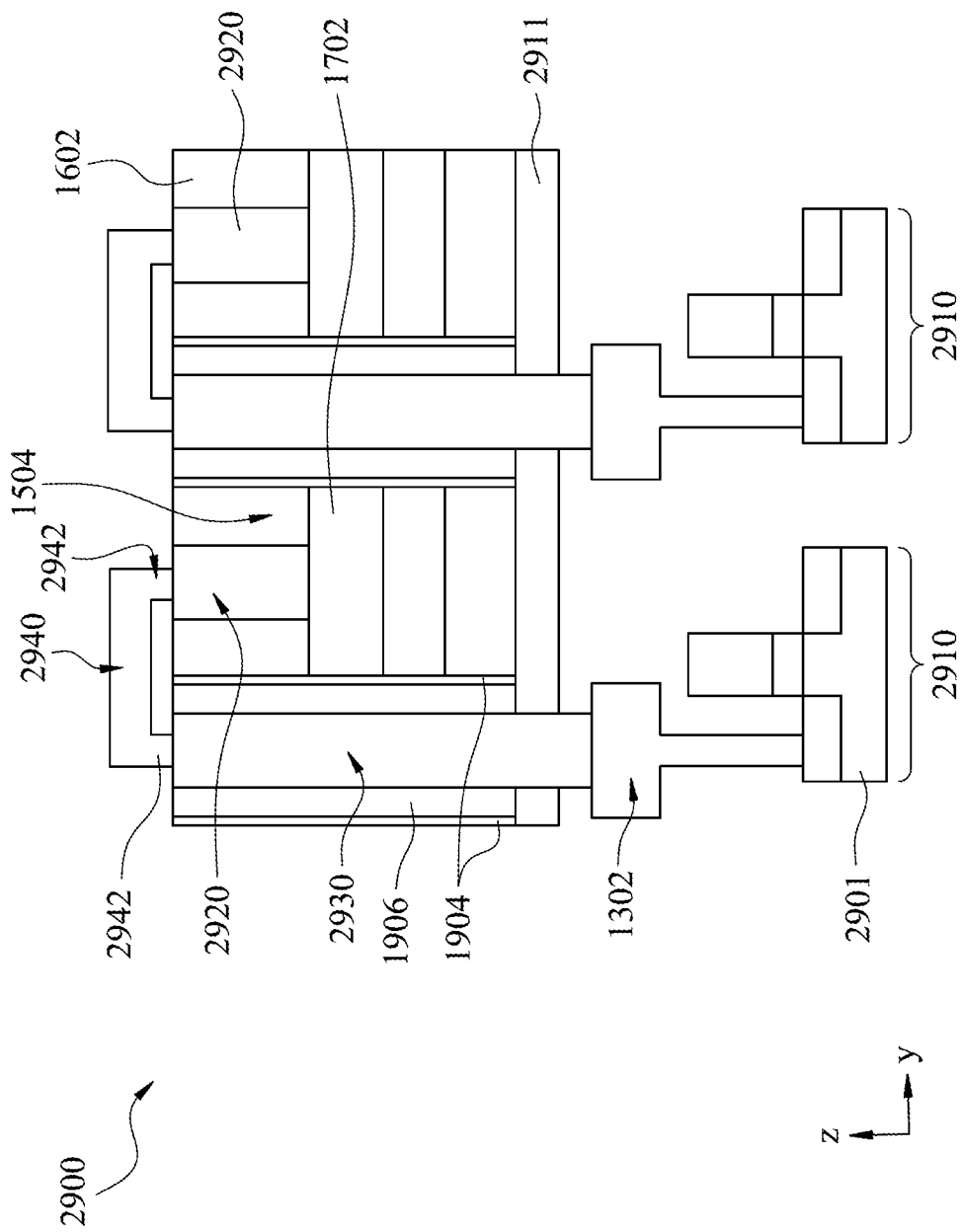

SYSTEMS AND METHODS OF TESTING MEMORY DEVICES

CROSS-REFERENCE TO RELATED APPLICATION

This application claims priority to and the benefit of U.S. Provisional Application No. 63/226,970, filed Jul. 29, 2021, entitled "WAT TEST METHOD FOR WL CuA VIA IN 3D MEMORY," which is incorporated herein by reference in its entirety for all purposes.

BACKGROUND

A non-volatile memory device retains data stored therein even when not powered. Two-dimensional memory devices in which memory cells are fabricated in a single layer over a substrate have reached physical limits in terms of increasing their degree of integration. Accordingly, three-dimensional (3D) non-volatile memory devices in which memory cells are stacked in a vertical direction over a substrate have been proposed. In general, a 3D (non-volatile) memory device includes a number of memory cells stacked on top of one another.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 29-30 illustrate a perspective view and a cross-sectional view, respectively, of a three-dimensional memory device, made by the method of FIG. 28, in accordance with some embodiments.

DETAILED DESCRIPTION

Figure 1:
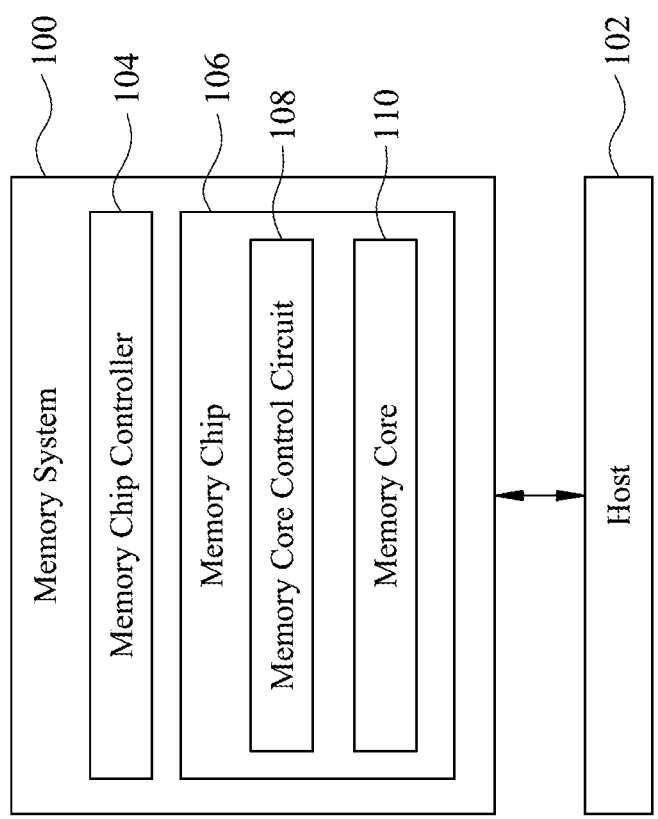
FIG. 1 illustrates a block diagram of a memory system and a host, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, a 3D memory device includes a number of memory blocks. Each memory block includes at least one memory array (or sub-array) of memory cells formed in a stack of insulating layers and conductive layers. In general, the conductive layers can function as or be coupled to gates or gate electrodes of the memory cells. Such conductive layers are typically referred to as word lines (WLs) of the memory cells. Over the wafer (or die) in which a memory array is formed, the WLs can laterally extend through the memory array and beyond one or both sides of the memory array, thereby allowing electrical interface with memory cells included in the memory array. Such extending portions of the WLs are sometimes referred to as part of an interface portion of each memory block, which may have a staircase profile. The interface portion, including portions of the WLs, can serve as an electrical interface for the memory block.

For example, the interface portion can further include a number of interconnect structures electrically coupling the WLs to one or more driver circuits. Such driver circuits can apply or otherwise provide (e.g., voltage) signals to the WLs so as to "drive" (e.g., turn on/off) the gates of the coupled memory cells. These interconnect structures are typically formed as via structures that vertically penetrate through the memory array. As a density of the memory cells becomes greater by having more layers of WLs vertically stacked on top of one another, an aspect ratio, or the ratio of the height divided by the width, of each of the interconnect structures may become higher accordingly. Thus, it may become increasingly challenging to monitor a yield of forming such interconnect structures. For example, some of the interconnect structures may be formed shorter than expected, which may form an open circuit.

The present disclosure provides various embodiments of systems and methods for testing the interconnect structures of a 3D memory device. For example, while fabricating the 3D memory device including a number of memory blocks (each of which includes a memory sub-array and one or more staircase interface portions), one or more test structures can be concurrently formed next to each of the memory sub-arrays. Further, while forming interconnect structures in each of the memory sub-arrays to electrically couple the memory sub-array to one or more corresponding driver circuits, each test structure can include a number of test interconnect (via) structures being concurrently formed to emulate, mimic, simulate, or otherwise follow the interconnect structures formed within the memory block. As such, the one or more test via structures can emulate the profiles and dimensions of the interconnect structures of each corresponding memory block.

In various embodiments, those test via structures of each test structure can be electrically coupled to one another in series, thereby allowing any issues of electrical connections related to the interconnect structures in the corresponding memory block to be accurately detected. For example, in response to detecting that the level of a current flowing through the serially coupled test via structures is under a threshold, the disclosed system can determine that there may be an open circuit present along such a conduction path constituted by the test via structures, which can in turn determine that there may be an open circuit present in one or more of the interconnect structures in the memory block. Further, the respective test structure(s) of the memory blocks can be electrically coupled to one another in series. As such, the memory block that has problematic electrical connections can be quickly and accurately identified, which will be discussed in further detail below.

FIG. 1 illustrates a block diagram including a memory system 100 and a host 102, in accordance with various embodiments. The memory system 100 may include a non-volatile storage system interfacing with the host 102 (e.g., a mobile computing device). In some embodiments, the memory system 100 may be embedded within the host 102. In some embodiments, the memory system 100 may include a memory card. As shown, the memory system 100 includes a memory chip controller 104 and a memory chip 106. Although a single memory chip 106 is shown, the memory system 100 may include more than one memory chip (e.g., four, eight or some other number of memory chips). The memory chip controller 104 can receive data and commands from the host 102 and provide memory chip data to the host 102.

The memory chip controller 104 may include one or more state machines, page registers, SRAM, and control circuitry for controlling the operation of the memory chip 106. The one or more state machines, page registers, static random access memory (SRAM), and control circuitry for controlling the operation of the memory chip 106 may be referred to as managing or control circuits. The managing or control circuits may facilitate one or more memory array operations, such as forming, erasing, programming, and reading operations.

In some embodiments, the managing or control circuits (or a portion of the managing or control circuits) for facilitating one or more memory array operations may be integrated within the memory chip 106. The memory chip controller 104 and memory chip 106 may be arranged on a single integrated circuit. In other embodiments, the memory chip controller 104 and memory chip 106 may be arranged on different integrated circuits. In some cases, the memory chip controller 104 and memory chip 106 may be integrated on a system board, logic board, or a printed circuit board (PCB).

The memory chip 106 includes memory core control circuit 108 and a memory core 110. In various embodiments, the memory core control circuit 108 may include logic for controlling the selection of memory blocks (or arrays) within the memory core 110 such as, for example, controlling the generation of voltage references for biasing a particular memory array into a read or write state, generating row and column addresses, testing the electrical connections of interconnect structures of the memory blocks, which will be discussed in further detail below.

The memory core 110 may include one or more two-dimensional arrays of non-volatile memory cells or one or more three-dimensional arrays of non-volatile memory cells. In an embodiment, the memory core control circuit 108 and memory core 110 are arranged on a single integrated circuit. In other embodiments, the memory core control circuit 108 (or a portion of the memory core control circuit 108) and memory core 110 may be arranged on different integrated circuits.

An example memory operation may be initiated when the host 102 sends instructions to the memory chip controller 104 indicating that the host 102 would like to read data from the memory system 100 or write data to the memory system 100. In the event of a write (or programming) operation, the host 102 will send to the memory chip controller 104 both a write command and the data to be written. The data to be written may be buffered by the memory chip controller 104 and error correcting code (ECC) data may be generated corresponding with the data to be written. The ECC data, which allows data errors that occur during transmission or storage to be detected and/or corrected, may be written to the memory core 110 or stored in non-volatile memory within the memory chip controller 104. In an embodiment, the ECC data are generated and data errors are corrected by circuitry within the memory chip controller 104.

The memory chip controller 104 can control operation of the memory chip 106. In one example, before issuing a write operation to the memory chip 106, the memory chip controller 104 may check a status register to make sure that the memory chip 106 is able to accept the data to be written. In another example, before issuing a read operation to the memory chip 106, the memory chip controller 104 may pre-read overhead information associated with the data to be read. The overhead information may include ECC data associated with the data to be read or a redirection pointer to a new memory location within the memory chip 106 in which to read the data requested. Once a read or write operation is initiated by the memory chip controller 104, the memory core control circuit 108 may generate the appropriate bias voltages for word lines and bit lines within memory core 110, and generate the appropriate memory block, row, and column addresses.

Figure 2:
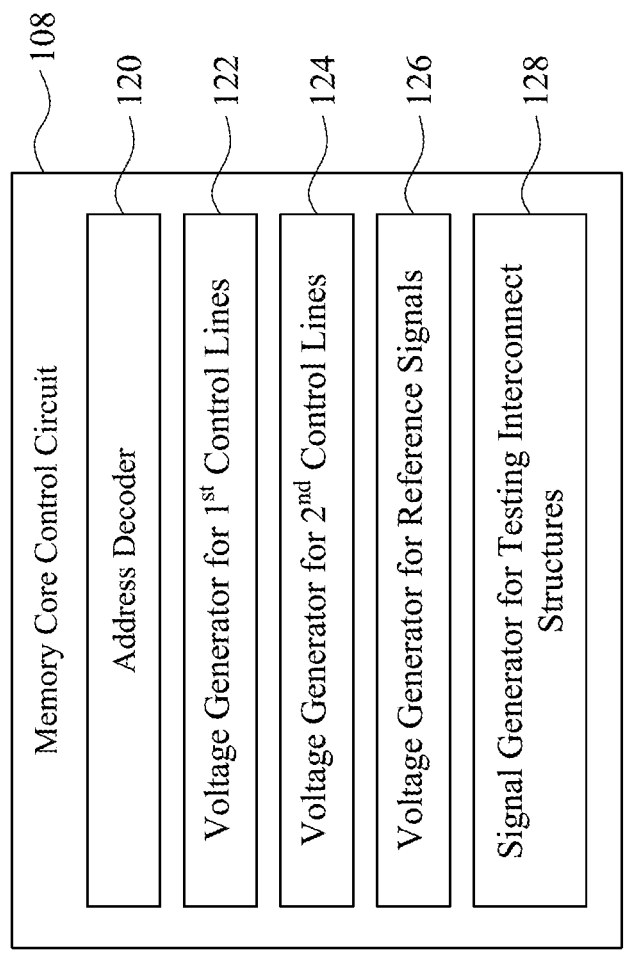
FIG. 2 illustrates a block diagram of a memory core control circuit, in accordance with some embodiments.

FIG. 2 illustrates one example block diagram of the memory core control circuit 108, in accordance with various embodiments. As shown, the memory core control circuit 108 include an address decoder 120, a voltage generator for first access lines 122, a voltage generator for second access lines 124, a signal generator for reference signals 126, and a signal generator for testing interconnect structures 128 (described in more detail below). In some embodiments, access lines may include word lines (WLs), bit lines (BLs), source/select lines (SLs), or combinations thereof. First access lines may include selected WLs, selected BLs, and/or selected SLs that are used to place non-volatile memory cells into a selected state. Second access lines may include unselected WLs, unselected BLs, and/or unselected SLs that are used to place non-volatile memory cells into an unselected state.

In accordance with various embodiments, the address decoder 120 can generate memory block addresses, as well as row addresses and column addresses for a particular memory block. The voltage generator (or voltage regulators) for first access lines 122 can include one or more voltage generators for generating first (e.g., selected) access line voltages. The voltage generator for second access lines 124 can include one or more voltage generators for generating second (e.g., unselected) access line voltages. The signal generators for reference signals 126 can include one or more voltage and/or current generators for generating reference voltage and/or current signals. The signal generator for testing interconnect structures 128 can generate control signals to control a number of switches to bypass one of the memory blocks at a time for testing the interconnect structures of the memory blocks, which will be discussed in further detail with respect to the method of FIG. 8.

Figure 3:
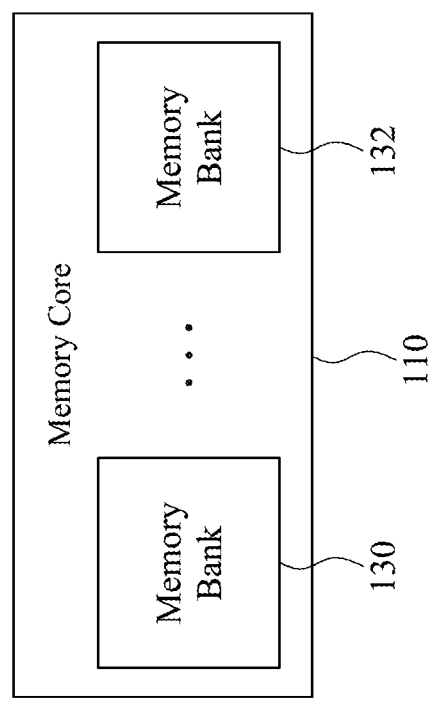
FIG. 3 illustrates a block diagram of a memory core, in accordance with some embodiments.
Figure 4:
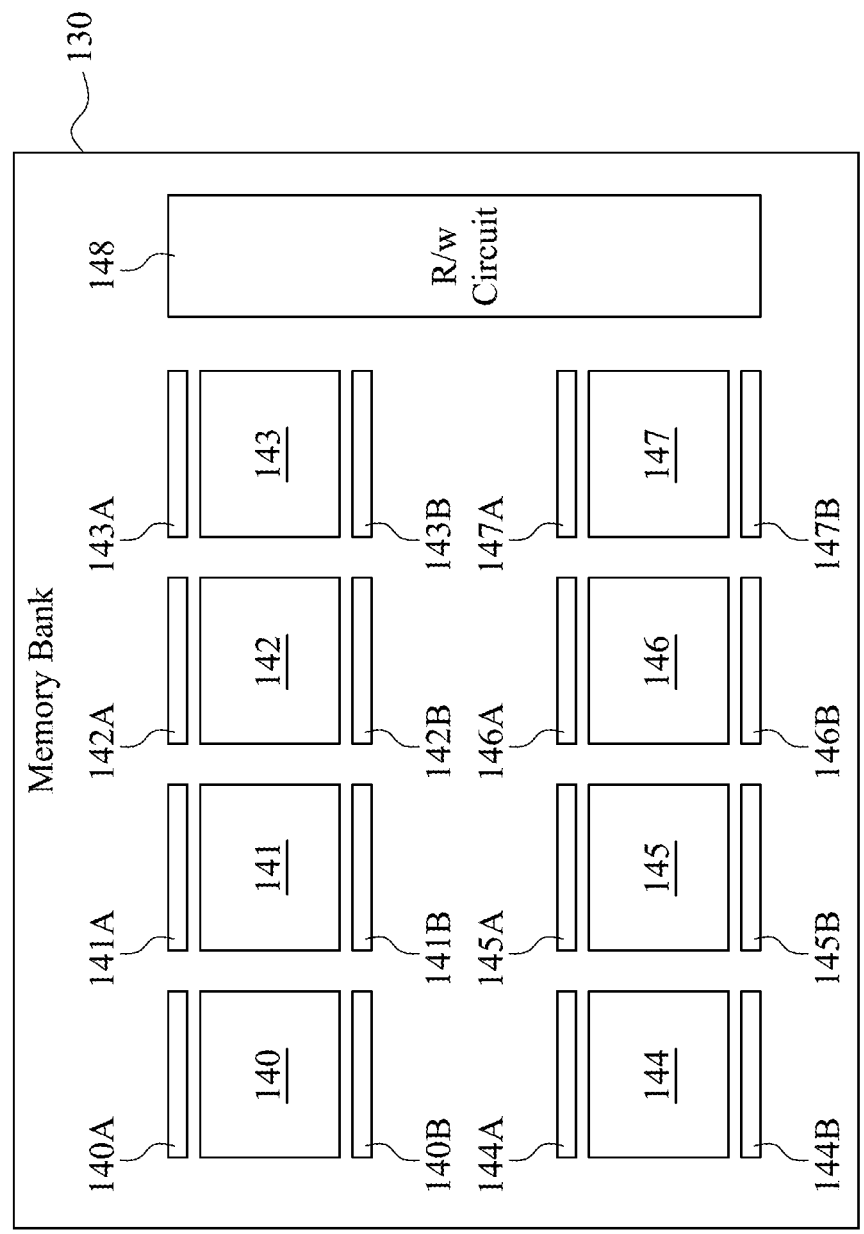
FIG. 4 illustrates a block diagram of a memory bank, in accordance with some embodiments.
Figure 5:
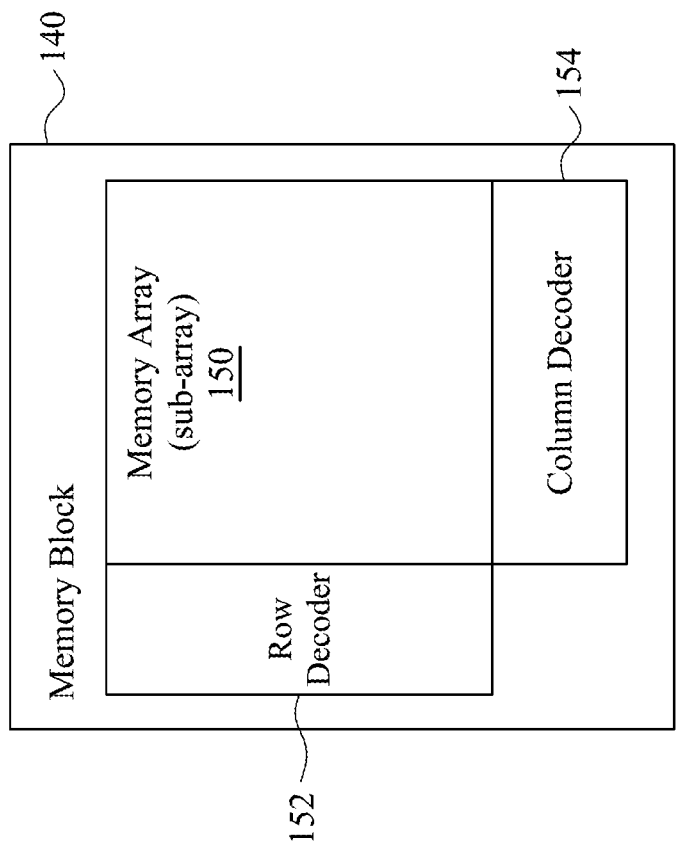
FIG. 5 illustrates a block diagram of a memory block, in accordance with some embodiments.

FIGS. 3-5 illustrate an example organization of the memory core 110, in accordance with various embodiments. The memory core 110 includes a number of memory banks, and each memory bank includes a number of memory blocks. Although an example memory core organization is disclosed where memory banks each include memory blocks, and memory blocks each include a group of non-volatile memory cells (arranged as a memory array or sub-array), other organizations or groupings also can be used, while remaining within the scope of the present disclosure.

FIG. 3 illustrates an example block diagram of the memory core 110, in accordance with various embodiments. As shown, the memory core 110 includes memory banks 130, 132, etc. It should be appreciated the memory core 110 can include any number of memory banks, while remaining within the scope of the present disclosure. For example, a memory core may include only a single memory bank or multiple memory banks (e.g., 16 or other number of memory banks).

FIG. 4 illustrates an example block diagram of one of the memory banks (e.g., 130) shown in FIG. 3, in accordance with various embodiments. As shown, the memory bank 130 includes memory blocks 140, 141, 142, 143, 144, 145, 146, and 147, pairs of test structures 140A and 140B, 141A and 141B, 142A and 142B, 143A and 143B, 144A and 144B, 145A and 145B, 146A and 146B, and 147A and 147B respectively corresponding to the memory blocks 140 to 147, and a read/write circuit 148. It should be appreciated the memory bank 130 can include any number of memory blocks (and any according number of the test structures), while remaining within the scope of the present disclosure. For example, a memory bank may include one or more memory blocks (e.g., 32 or other number of memory blocks per memory bank). The read/write circuit 148 can include circuitry for reading and writing memory cells within the memory blocks 140 to 147. Further, although two test structures correspond to each memory block in the illustrated example of FIG. 4 (and the following figures), it should be appreciated that any number of test structures can correspond to one memory block, while remaining within the scope of the present disclosure.

In various embodiments, the test structures 140A through 147B, together with the corresponding memory blocks 140 through 147, may be formed on a single die (e.g., a singulated or cut die). Further, each pair of test structures may be disposed next to their corresponding memory block. For example, the test structures 140A and 140B may be physically disposed on top and bottom of the memory block 140, respectively. However, it should be understood that a pair of the test structures may be physically arranged next to the corresponding memory block in any manner. Continuing using the memory block 140 as a representative example, the test structures 140A and 140B may be disposed on the left and the right of the memory block 140, respectively.

In some other embodiments, the test structures may not be present on a single die (e.g., a singulated or cut die). For example, while the memory blocks of a memory core (e.g., 110) are formed on a particular die over a wafer, the corresponding test structures may be formed along scribe lines over the wafer. A scribe line (sometimes referred to as a kerf or frame) is an area in a wafer, which is used to singulate or otherwise separate individual dies at the end of wafer processing. In such embodiments, the test structures may not be present on a singulated die.

In some embodiments, the read/write circuit 148 may be shared across multiple memory blocks within a memory bank. This allows chip area to be reduced because a single group of read/write circuit 148 may be used to support multiple memory blocks. However, in some embodiments, only a single memory block may be electrically coupled to the read/write circuit 148 at a particular time to avoid signal conflicts. In some embodiments, the read/write circuit 148 may be used to write one or more pages of data into the memory blocks 140-147 (or into a subset of the memory blocks). The non-volatile memory cells within the memory blocks 140-147 may permit direct over-writing of pages (i.e., data representing a page or a portion of a page may be written into the memory blocks 140-147 without requiring an erase or reset operation to be performed on the non-volatile memory cells prior to writing the data).

In some cases, the read/write circuit 148 may be used to program a particular non-volatile memory cell to be in one of multiple (e.g., 2, 3, etc.) data states. For example, the particular non-volatile memory cell may include a single-level or multi-level non-volatile memory cell. In one example, the read/write circuits 148 may apply a first voltage difference (e.g., 2V) across the particular non-volatile memory cell to program the particular non-volatile memory cell into a first state of the multiple data states or a second voltage difference (e.g., 1V) across the particular non-volatile memory cell that is less than the first voltage difference to program the particular non-volatile memory cell into a second state of the multiple data states.

FIG. 5 illustrates an example block diagram of one of the memory blocks (e.g., 140) of the memory bank 130 of FIG. 4, in accordance with various embodiments. As shown, the memory block 140 includes a memory array (or sometimes referred to as a memory sub-array) 150, a row decoder 152, and a column decoder 154. As disclosed herein, the memory array 150 may include a contiguous group of non-volatile memory cells, each of which can be accessed through a respective combination of access lines (e.g., a combination of one of contiguous WLs, one of contiguous BLs, and one of contiguous SLs). Such access lines may sometimes be referred to as an interface portion of the memory block, in some embodiments. The memory array 150 may include one or more layers of non-volatile memory cells. The memory array 150 may include a two-dimensional memory array or a three-dimensional memory array. The interface portion may be formed within the memory array 150, which will be shown and discussed in further detail below.

The row decoder 152 can decode a row address and select a particular WL, when appropriate (e.g., when reading or writing non-volatile memory cells in the memory array 150). The column decoder 154 can decode a column address and select one or more BLs/SLs in the memory array 150 to be electrically coupled to read/write circuits, such as the read/write circuit 148 in FIG. 4. As a non-limiting example, the number of WLs is in the range of 4K per memory layer, the number of BLs/SLs is in the range of 1K per memory layer, and the number of memory layers is 4, which renders about 16M non-volatile memory cells contained in the memory array 150 (of the memory block 140). Continuing with the same example, a test structure (e.g., 140A and/or 140B), corresponding to the memory block 140, may include the similar number of WLs (e.g., 4K) and the similar number of memory layers (e.g., 4), but a much less number of BLs/SLs, which can allow the test structures to occupy an optimized real estate.

Figure 6:
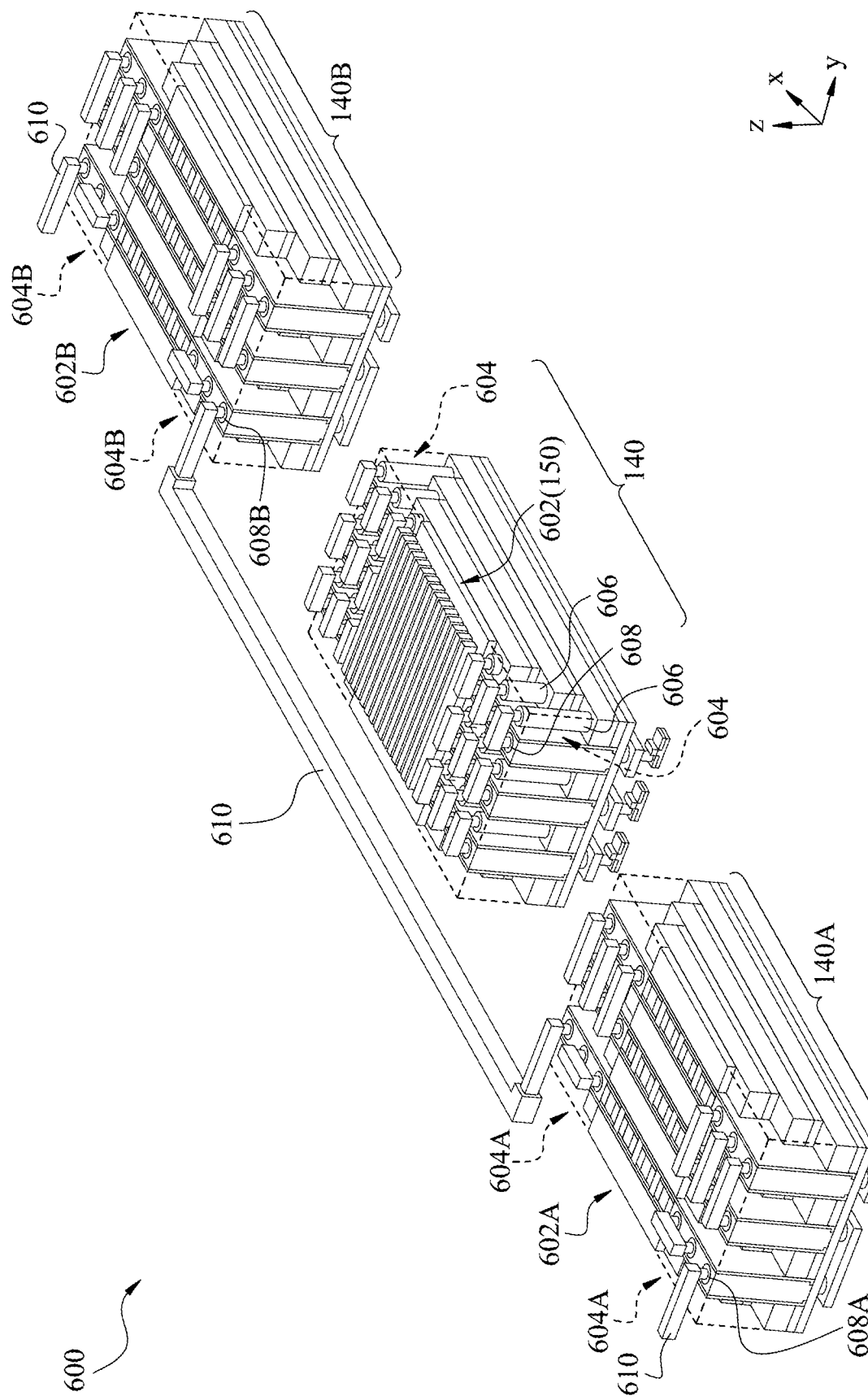
FIG. 6 illustrates a perspective view of a memory block and one or more test structures, in accordance with some embodiments.

FIG. 6 illustrates a perspective view of a portion of the memory block 140, and the test structures 140A and 140B, according to various embodiments of the present disclosure. In the following discussions, the memory block 140 (and the corresponding test structures 140A-B) are selected as a representative example. It should be understood that other memory blocks (and corresponding test structures), as disclosed herein, are substantially similar to the memory block 140 (and the test structures 140A-B), and thus, the discussions are not repeated. Further, the perspective view of FIG. 6 is simplified, and thus, it should be understood that any of various other features/components can also be included in FIG. 6, while remaining within the scope of the present disclosure.

As shown, the memory block 140 includes the memory array (or sub-array) 150, which is herein referred to as memory array 602. Such a memory array 602 includes a number of memory cells formed across a number of memory layers (e.g., 3 memory layers as shown) stacked on top of one another along a vertical direction, e.g., the Z-direction. Each of the memory cells may include a single-gate or a surrounding-gate transistor, which will be discussed in further detail below. The memory block 140 includes a number of interface portions 604 located across the memory array 602, which allows each memory cell of the memory array 602 to be accessed (or otherwise controlled). In some embodiments, the interface portions 604 each has a staircase or step profile, as described later in further detail herein. To electrically access the memory array 602 through the interface portion 604, the memory block 140 further includes a number of first interconnect structures 606 (e.g., first via structures) extending along the Z direction that land on respective stairs of the WLs (e.g., first control structures) in the interface portion 604. The memory block 140 further includes a number of second interconnect structures 608 (e.g., second via structures) extending along the Z-direction that electrically couple to driver circuits underneath the memory block 140. The memory block 140 further includes a number of lateral interconnect structures (e.g., extending along the Y-direction) that are WL, BL, and SL routing. These lateral interconnect structures are explained in more detail below with FIGS. 29 and 30.

In various embodiments, each of the test structures 140A and 140B is formed to emulate the interface portion 604 and the first interconnect structures 606 of the memory block 140. Thus, each of the test structures 140A and 140B can have the similar configuration as the memory block 140. For example, the test structure 140A includes a test memory array 602A having a number of memory cells formed across a number of memory layers, one or more test interface portions 604A (each of which has a staircase or step profile), and a number of test interconnect structures 608A; and the test structure 140B includes a test memory array 602B having a number of memory cells formed across a number of memory layers, one or more test interface portions 604B (each of which has a staircase or step profile), and a number of test interconnect structures 608B. In various embodiments, the test interconnect structures are disposed apart from the staircase profile along a lateral direction (e.g., the Y-direction). For example, the test interconnect structures may be alternately interleaved with the staircase profile along the lateral direction. Specifically, along the lateral direction, a subset of the test interconnect structures 608A/608B are interposed between two corresponding subsets of stairs or steps of the whole staircase profile, as shown in FIG. 6. According to various embodiments, the test interconnect structures 608A and 608B are formed concurrently with the second interconnect structures 608 of the memory block 140 in order to mirror the profiles and dimensions of the second interconnect structures 608, which will be discussed in further detail below.

Further, the test interconnect structures 608A of the test structure 140A are electrically coupled to one another through a number of conductive structures 610; and the test interconnect structures 608B of the test structures 140B are electrically coupled to one another through a number of conductive structures 610. Specifically, the test interconnect structures 608A may be electrically coupled to one another in series; and the test interconnect structures 608B may be electrically coupled to one another in series. Such serially connected test interconnect structures 608A and serially connected test interconnect structures 608B may be electrically connected to each other through a number of conductive structures 610 (e.g., disposed above the test structures 140A and 140B). Accordingly, the conductive structures 610 may sometimes be referred to as top metal routings or top conductive structures 610.

By electrically coupling the test interconnect structures of at least one of the test structures 140A or 140B in series (while electrically isolated from the second interconnect structures 608 of the memory block 140), electrical connections of the second interconnect structures 608 can be accurately examined through the at least one test structure, and normal operation of the memory block 140 will not be interfered. For example, since the test interconnect structures of the test structure(s) are formed concurrently with the interconnect structures within the memory block 140 (e.g., through the same lithography process, and then the same etching process), any defect formed on the second interconnect structures 608 within the memory block 140 can be mirrored to (or reflected on) the test interconnect structures 608A and 608B within the test structure(s). As such, by testing whether the level of a current flowing through the serially connected test interconnect structures satisfies a condition (e.g., less than a threshold), whether there is any open circuit present between the test interconnect structures and the test interface portions can be identified or otherwise determined. Further, by serially connecting the respective test structures of different memory blocks, which of the memory blocks contains electrical connection issues in its second interconnect structures can also be accurately identified, which will be discussed in further detail as follows.

Figure 7:
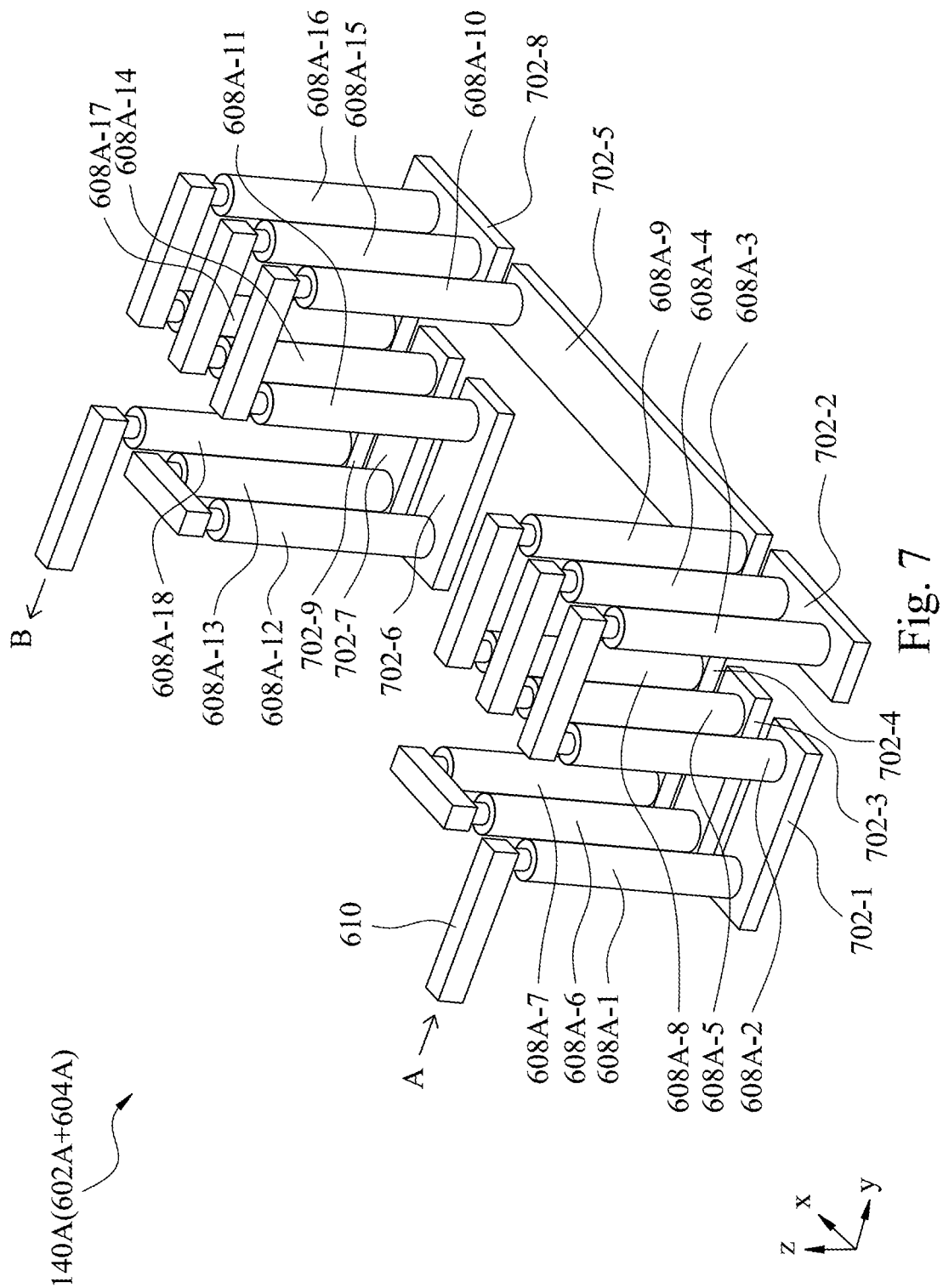
FIG. 7 illustrates a perspective view of a portion of a test structure including an interface portion and a number of test interconnect structures, in accordance with some embodiments.

To illustrate how to test the electrical connections of a number of serially connected test interconnect structures within a test structure, a portion of the test structure 140A that includes only the test interface portions 604A and the test interconnect structures 608A, which is selected as a representative example, is reproduced in FIG. 7.

As illustrated, the test structure 140A further include a number of bottom metal routings 702 (e.g., bottom via structures, bottom interconnect structures, lateral test interconnect structures, bottom metal structures, or otherwise bottom conductive structures) to electrically couple the test interconnect structures 608A to each other in series. Such bottom metal routings 702 are disposed below the test structure 140A, as opposed to the top metal routings 610 disposed above the test structure 140A, in some embodiments. The test interconnect structures 608A extend (e.g., in the Z-direction) through a number of inner spacers (or dielectric strips) that extend along the X-direction. In various embodiments, the test interconnect structures 608A can mimic the dimensions and profiles of the second interconnect structures 608 formed within the memory block 140, which will be discussed in further detail below.

Each of the test interconnect structures 608A can extend along the Z-direction to electrically couple to one of the test bottom metal routings 702, and each of the test interconnect structures 608A may share a same height along the Z-direction. For example in FIG. 7, the test interconnect structures 608A-1 and 608A-2 are coupled to one of the metal routings 610 on one end and coupled to the test bottom metal routing 702-1 on the other end. The test interconnect structures 608A-3 and 608A-4 are coupled to one of the metal routings 610 on one end and coupled to the test bottom metal routing 702-2 on the other end. The test interconnect structures 608A-5 and 608A-6 are coupled to one of the metal routings 610 on one end and coupled to the test bottom metal routing 702-3 on the other end. The test interconnect structures 608A-7 and 608A-8 are coupled to one of the metal routings 610 on one end and coupled to the test bottom metal routing 702-4 on the other end. The test interconnect structures 608A-9 and 608A-10 are coupled to one of the metal routings 610 on one end and coupled to the test bottom metal routing 702-5 on the other end.

The test interconnect structures 608A-11 and 608A-12 are coupled to one of the metal routings 610 on one end and coupled to the test bottom metal routing 702-6 on the other end. The test interconnect structures 608A-13 and 608A-14 are coupled to one of the metal routings 610 on one end and coupled to the test bottom metal routing 702-7 on the other end. The test interconnect structures 608A-15 and 608A-16 are coupled to one of the metal routings 610 on one end and coupled to the test bottom metal routing 702-8 on the other end. The test interconnect structures 608A-17 and 608A-18 are coupled to one of the metal routings 610 on one end and coupled to the test bottom metal routing 702-9 on the other end.

With such a conduction path by serially connecting the test interconnect structures 608A to the test bottom metal routings 702, electrical connections between the test interconnect structures 608A and the second interconnect structures 608 in the memory block can be accurately examined. In various embodiments, by applying a first signal (e.g., a voltage signal) on one end of the test structure 140A (arrow "A" indicated in FIG. 7), the level of a second signal (e.g., a current signal) detected on the other end of the test structure 140A (arrow "B" indicated in FIG. 7) can be used to determine whether one or more open circuits are present along this conduction path. For example, if there is any open circuit present along the conduction path, the level of the second signal may be lower than a threshold. The threshold can be pre-calibrated based on various process parameters (e.g., the resistivity of a material of the test interconnect structures 608A, a number of the test interconnect structures 608A, etc.). On the other hand, if there is no open circuit present, the level of the second signal should be equal to or greater than the threshold.

In response to determining the presence of an open circuit in the test structure, it is determined that an open circuit can also be present between the second interconnect structures electrically coupled to the driver circuits and conductive structures (e.g., WLs) of a corresponding memory block. This can be because the memory block and the test structure share the same processing steps to make the interconnect structures and test interconnect structures. In some embodiments, more than one test structure, e.g., serially connecting the test structures 140A and 140B as illustrated in FIG. 6, can be used to test the electrical connections between interconnect structures and driver circuits in a corresponding memory block, e.g., the memory block 140. Further, the operation principle can be applied to test a number of memory blocks, the memory blocks 140 to 147, which will be discussed with respect to the method of FIG. 8.

Figure 8:
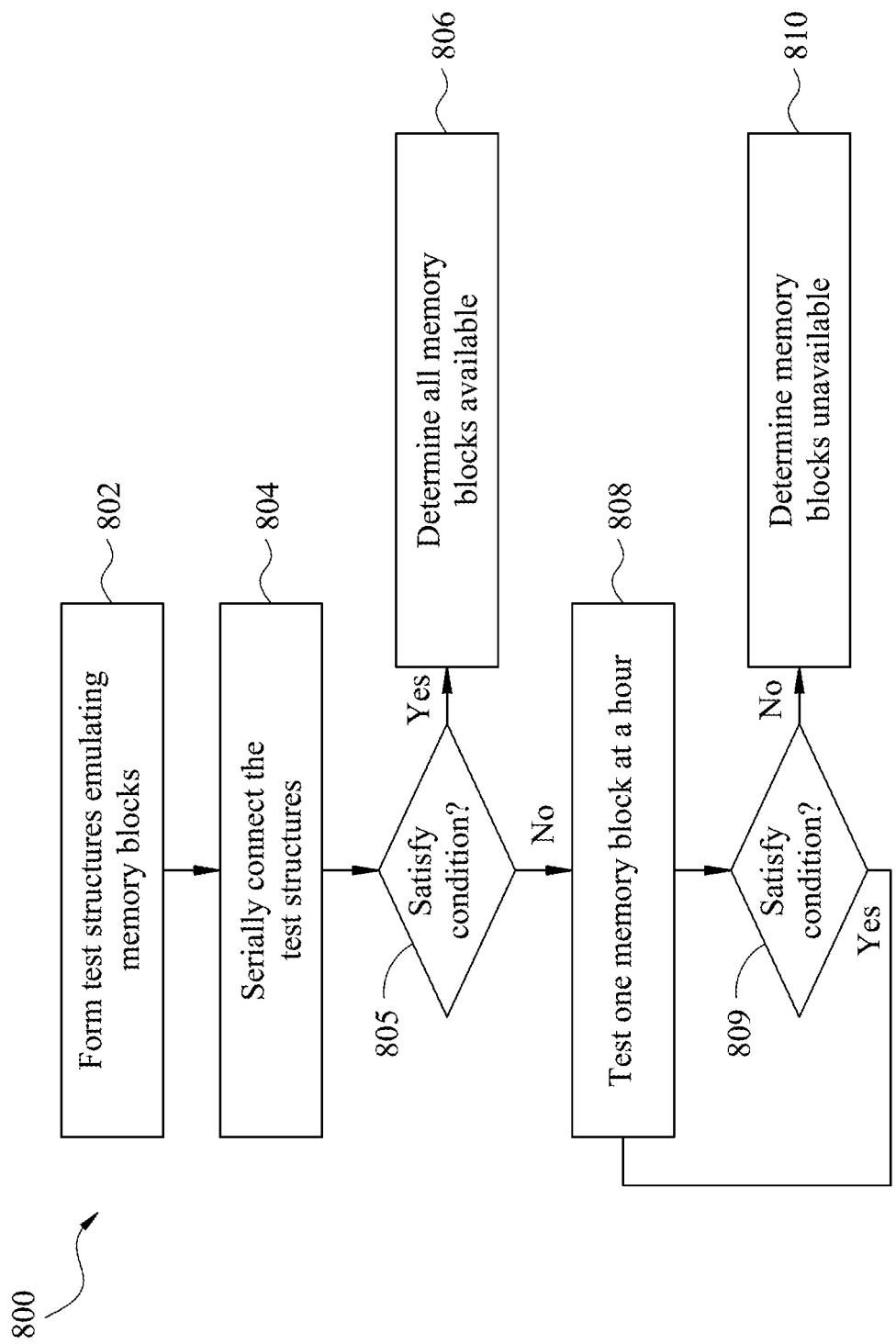
FIG. 8 illustrates a flow chart of an example method to test a three-dimensional memory device, in accordance with some embodiments.

Referring to FIG. 8, depicted is a flow chart of an example method 800 for testing electrical connections of second interconnect structures of a number of memory blocks, in accordance with various embodiments. Some of the functionalities or operations of the method 800 may be implemented using, or performed by, one or more components of the memory core control circuit 108 depicted in FIG. 2, e.g., the signal generator for testing interconnect structures 128 (hereinafter "signal generator 128"). It is noted that the method 800 is merely an example, and is not intended to limit the present disclosure. Accordingly, it is understood that additional operations may be provided before, during, and after the method 800, and that some other operations may only be briefly described herein.

The method 800 start with operation 802 in which a number of test structures that emulate a number of memory blocks, respectively, are formed. In some embodiments, there can be one or more test structures that emulate each memory block. The one or more test structures can be disposed next to its or their corresponding memory block. In some embodiments, each of the test structures can emulate, simulate, or otherwise follow at least the second interconnect structures (e.g., second vias) of a corresponding memory block.

Using the memory bank 130 that includes eight memory blocks 140 to 147 (FIG. 4) as an example in the following discussions of the method 400, FIG. 9 reproduces four of these memory blocks 140 to 143, with their corresponding (emulating) test structures 140A-B to 143A-B disposed next thereto, respectively. However, it should be appreciated that the method 800 is not limited to test any number of memory blocks. For example, by forming a number of test structures in accordance with any number of memory blocks, the method 800 can be used to test or otherwise monitor the electrical connections of each of such memory blocks. In various embodiments, the test structures 140A-B can each have a number of test interconnect structures (e.g., 608A-1 through 608A-18 as shown in FIG. 7) that emulate second interconnect structures 608 of the memory block 140.

The method 800 proceeds to operation 804 in which the test structures are electrically connected to one another in series. In addition to electrically coupling the test structures through the test interconnect structures in series (as illustrated with respect to FIG. 7), one of the one or more (e.g., 2) test structures, corresponding to a particular memory block, is connected to the other of the one or more test structures. Further, one of the one or more test structures, corresponding to a first memory block, is connected to one of the one or more test structures, corresponding to a second memory block. Such a connection across different memory blocks may be controlled through a number of switches. In some embodiments, the signal generator 128 can control (e.g., activate/inactivate, or otherwise turn on/off) those switches, so as to connect all of the memory blocks in series or bypass one or more of the memory blocks, which will be discussed below.

Figure 9:
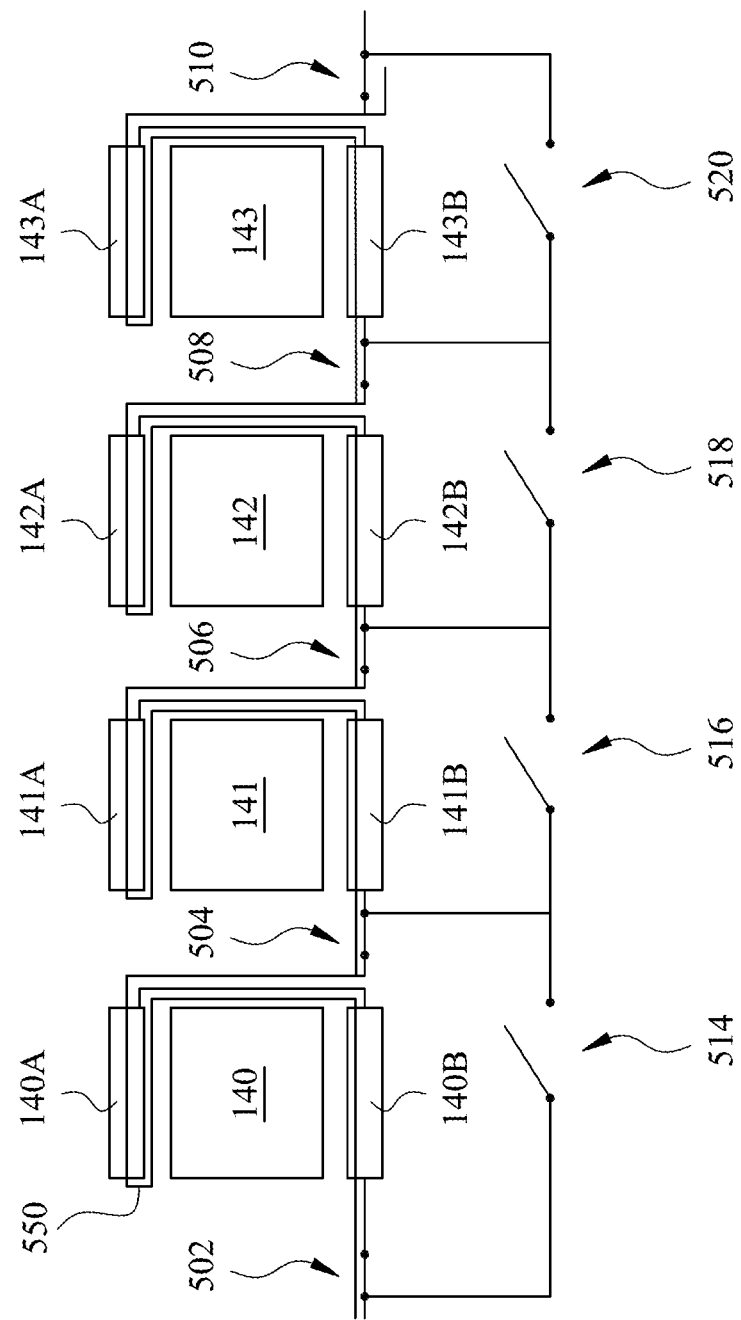
FIG. 9 illustrates a block diagram of a number of test structures electrically coupled to one another in series, in accordance with some embodiments.

For example in FIG. 9, the test structures 140A and 140B, corresponding to the memory block 140, are connected to each other. Further, the test structure 140B can be connected to a component (not shown) through a switch 502 (when activated), and the test structure 140A can be connected to one of the test structures, 141B, corresponding to the next memory block 141, through a switch 504 (when activated). The test structures 141A and 141B, corresponding to the memory block 141, are connected to each other. Further, the test structure 141A is connected to one of the test structures, 142B, corresponding to the next memory block 142, through a switch 506 (when activated). The test structures 142A and 142B, corresponding to the memory block 142, are connected to each other. Further, the test structure 142A is connected to one of the test structures, 143B, corresponding to the next memory block 143, through a switch 508 (when activated). The test structures 143A and 143B, corresponding to the memory block 143, are connected to each other. Further, the test structure 143A is connected to a component (not shown) through a switch 510 (when activated).

Moreover, switches 514, 516, 518, and 520 can provide one or more bypass paths. Each of the switches can correspond to a respective memory block to bypass the memory block (and its corresponding test structure(s)). Specifically, the switch 514 can be alternately activated with respect to the switch 504 to bypass the memory block 140; the switch 516 can be alternately activated with respect to the switch 506 to bypass the memory block 141; the switch 518 can be alternately activated with respect to the switch 508 to bypass the memory block 142; and the switch 520 can be alternately activated with respect to the switch 510 to bypass the memory block 143. For example, when the switch 504 is deactivated and the switch 514 is activated, the memory block 140 (and the corresponding test structures 140A-B) can be bypassed; when the switch 506 is deactivated and the switch 516 is activated, the memory block 141 (and the corresponding test structures 141A-B) can be bypassed; when the switch 508 is deactivated and the switch 518 is activated, the memory block 142 (and the corresponding test structures 142A-B) can be bypassed; and when the switch 510 is deactivated and the switch 520 is activated, the memory block 143 (and the corresponding test structures 143A-B) can be bypassed.

In some embodiments, each of the switches 502 to 520 may include an n-type metal-oxide-semiconductor (MOS) transistor, a p-type MOS transistor, a transmission gate, a fuse, an anti-fuse, combinations thereof, or any other suitable transistor. It should be understood that the switches 502 to 520 can each include a device/feature suitable to functions as a switch, while remaining within the scope of the present disclosure. In some embodiments, the switches 502 to 520 can be formed as part of a memory device that contains the memory blocks 140-143. Further, the switches 502 to 520 can be formed above or below the memory blocks 140-143. For example, the switches 502 to 520 may be formed on the front-end of a substrate, while the memory blocks 140-143 may be formed on the back-end of the substrate. In another example, the memory blocks 140-143 may be formed on the back-end of a substrate, and the switches 502 to 520 may also be formed on the back-end, and over the memory blocks 140-143. In yet another example, the switches 502 to 520 can be embedded into processing of the memory blocks 140-143. In yet another example, the switches 502 to 520 can be separated formed as a separated device, and then integrated into a memory device containing the memory blocks 140-143.

In some embodiments, the signal generator 128, by default, can activate the switches 502 to 510 and deactivate the switches 514 to 520, so as to electrically connect the test structures in series (operation 404). As such, a conduction path 550 can be provided through the test structures 140B, 140A, 141B, 141A, 142B, 142A, 143B, and 143A, as shown in FIG. 5.

Next, the method 800 proceeds to a first determination operation 805 to determine whether a condition is satisfied. For example, the signal generator 128 can apply a first signal (e.g., a voltage signal) on one end of the conduction path 550, and detect the level of a second signal (e.g., a current signal) on the other end of the conduction path 550. Upon detecting the second signal, the signal generator 128 can determine whether the level of the second signal satisfies a condition (e.g., greater than a threshold). The threshold can be pre-calibrated based on various process parameters (e.g., the resistivity of a material of the test interconnect structures of the test structures 140A to 143B, a number of the test interconnect structures formed across the test structures 140A to 143B, etc.).

If the condition is satisfied, the method 800 proceeds to operation 806 to determine all the memory blocks 140 to 143 as available memory blocks. Alternatively stated, the electrical connections between the second interconnect structures and the driver circuits of each of the memory blocks 140 to 143 can be determined as having no open circuit issues. On the other hand, if the condition is not satisfied, the method 800 proceeds to operation 808 to test one of the memory blocks at a time. To test one of the memory blocks at a time, the rest of the memory blocks (and their test structure(s)) may be bypassed, which allows the memory block(s) that have open circuit issues to be identified.

Figure 10:
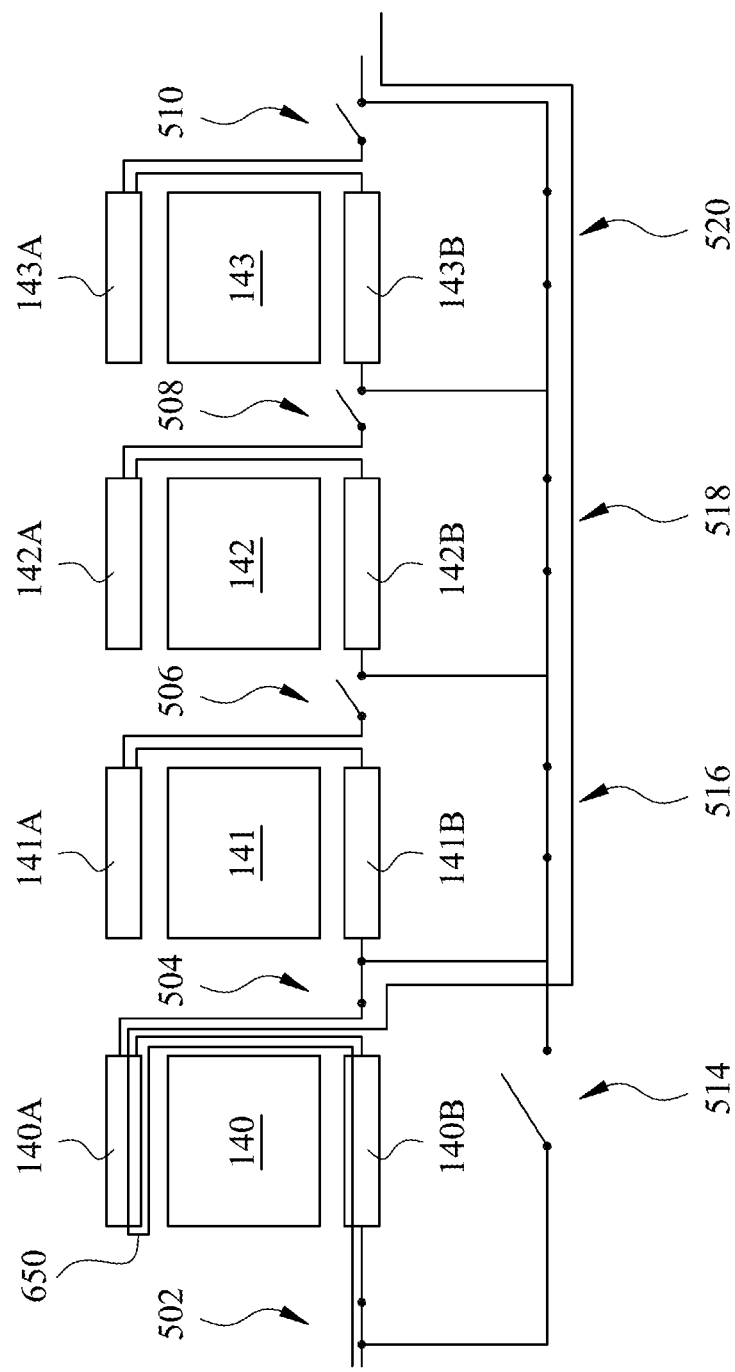
FIG. 10 illustrates an example block diagram of a number of test structures in which some of the test structures are bypassed, in accordance with some embodiments.

For example, upon determining that the level of the detected second signal does not satisfy the threshold (at operation 805), the signal generator 128 can first test the memory block 140 by bypassing the rest of the memory blocks (e.g., the memory blocks 141 to 143 in the current example). Specifically, the signal generator 128 can deactivate the switches 506 through 514 and activate the switches 502 through 504 so as to form a conduction path 650. The conduction path 650 can be provided through only the test structures for the memory block 140 being tested (e.g., 140A and 140B), as illustrated in FIG. 10. Along such a conduction path, the test structures, corresponding to the rest of the memory blocks 141 to 143, are bypassed. The signal generator 128 can again determine whether the level of the second signal satisfies the threshold (operation 809).

If not (i.e., the level of the second signal equal to or less than the threshold), the method 800 can proceed to operation 810 in which the tested memory block is determined to have the connection issues. In some embodiments, the signal generator 128 may determine the currently tested memory block as unavailable. The signal generator 128 can record identification (e.g., address information) of such an unavailable memory block, which may be used as flag to allow a user (e.g., host 102 of FIG. 1) to skip accessing the memory block.

Figure 11:
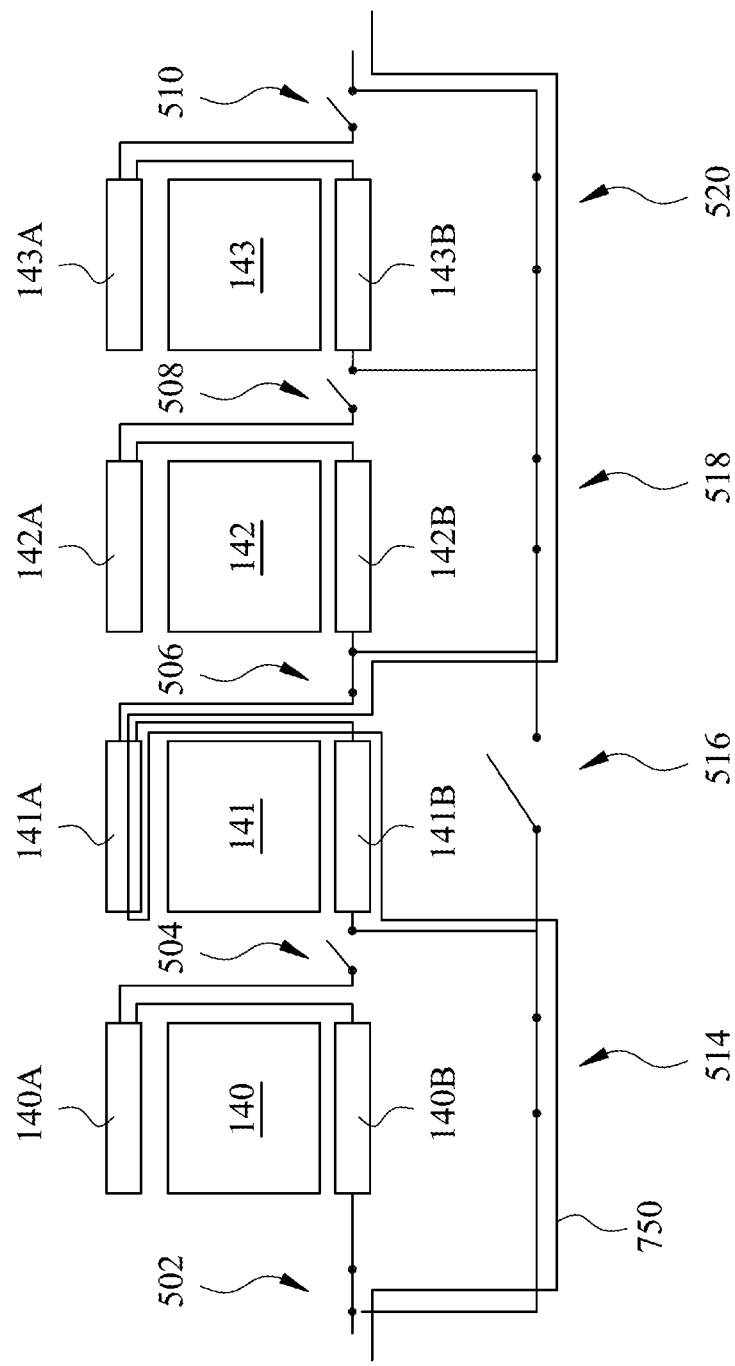
FIG. 11 illustrates another example block diagram of a number of test structures in which some of the test structures are bypassed, in accordance with some embodiments.

On the other hand, if so (i.e., the level of the second signal greater than the threshold), the method 800 can again proceed to operation 808 to test the next memory block by bypassing the rest of the memory blocks. For example, the signal generator 128 can then test the memory block 141 by bypassing the rest of the memory blocks (e.g., the memory blocks 140, 142, and 143 in the current example). Specifically, the signal generator 128 can deactivate the switches 502 through 510 and 516, and activate the switches 514, 518, and 520 so as to form a conduction path 750. The conduction path 750 can be provided through only the test structures for the memory block 141 being tested (e.g., 141A and 141B), as illustrated in FIG. 11. Along such a conduction path, the test structures, corresponding to the rest of the memory blocks 140, 142, and 143, are bypassed. The signal generator 128 can again determine whether the level of the second signal satisfies the threshold (operation 809). If not, the signal generator 128 may determine the currently tested memory block as unavailable; and if so, the signal generator 128 may continue testing the rest of the memory blocks by iteratively performing the operations 808 and 809. The signal generator 128 may continue performing such an iteration of operations until the unavailable memory block(s) are identified.

Figure 12:
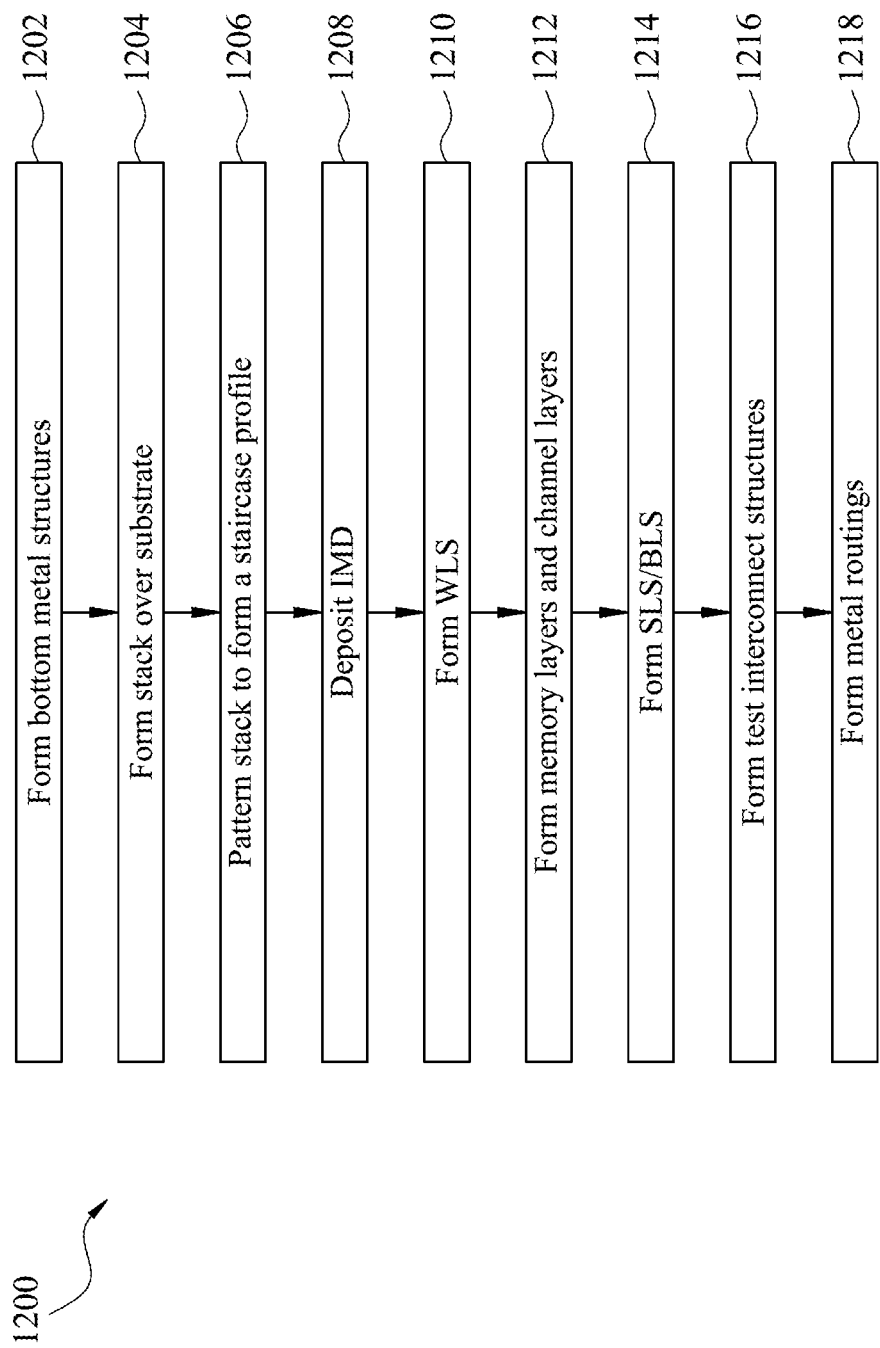
FIG. 12 illustrate a flow chart of an example method to make a three-dimensional memory device test structure, in accordance with some embodiments.

FIG. 12 illustrates a flowchart of a method 1200 to form a memory device test structure, according to various embodiments. For example, at least some of the operations (or steps) of the method 1200 can be used to form a three-dimensional memory device (e.g., any of the test structures 140A-B, 141A-B, 142A-B, 143A-B, 144A-B, 145A-B, 146A-B, and 147A-B, as herein disclosed). It should be noted that the method 1200 is merely an example, and is not intended to limit the present disclosure. Accordingly, it is understood that additional operations may be provided before, during, and after the method 1200 of FIG. 12, and that some other operations may only be briefly described herein.

In some embodiments, operations of the method 1200 may be associated with cross-sectional views of an example 3D memory device test structure 1300 at various fabrication stages as shown in FIGS. 13, 14, 15, 16, 17, 18, 19, 20, 21, 22, 23, 24, 25, 26, and 27, respectively, which will be discussed in further detail below. While various operations of the method 1200 and associated illustrations shown in FIGS. 13-27 are described with respect to the 3D memory device test structure 1300 that includes a number of single-gate memory cells, it should be understood that the operations can be equally applicable to any of various other types of memory cells such as, for example, surrounding-gate memory cells.

In brief overview, the method 1200 starts with operation 1202 of forming bottom metal structures. The method 1200 proceeds to operation 1204 in of forming a stack over a substrate. The method 1200 proceeds to operation 1206 of patterning the stack in a staircase profile. The method 1200 proceeds to operation 1208 of depositing an intermetal dielectric (IMD). The method 1200 proceeds to operation 1210 of forming a number of WLs. The method 1200 proceeds to operation 1212 of forming a number of memory layers and a number of channel layers. The method 1200 proceeds to operation 1214 forming a number of source/select line (SLs) and number of bit lines (BLs). The method 1200 proceeds to operation 1216 of forming a number of test interconnect structures. The method 1200 proceeds to operation 1218 of forming a number of metal routings.

Figure 13:
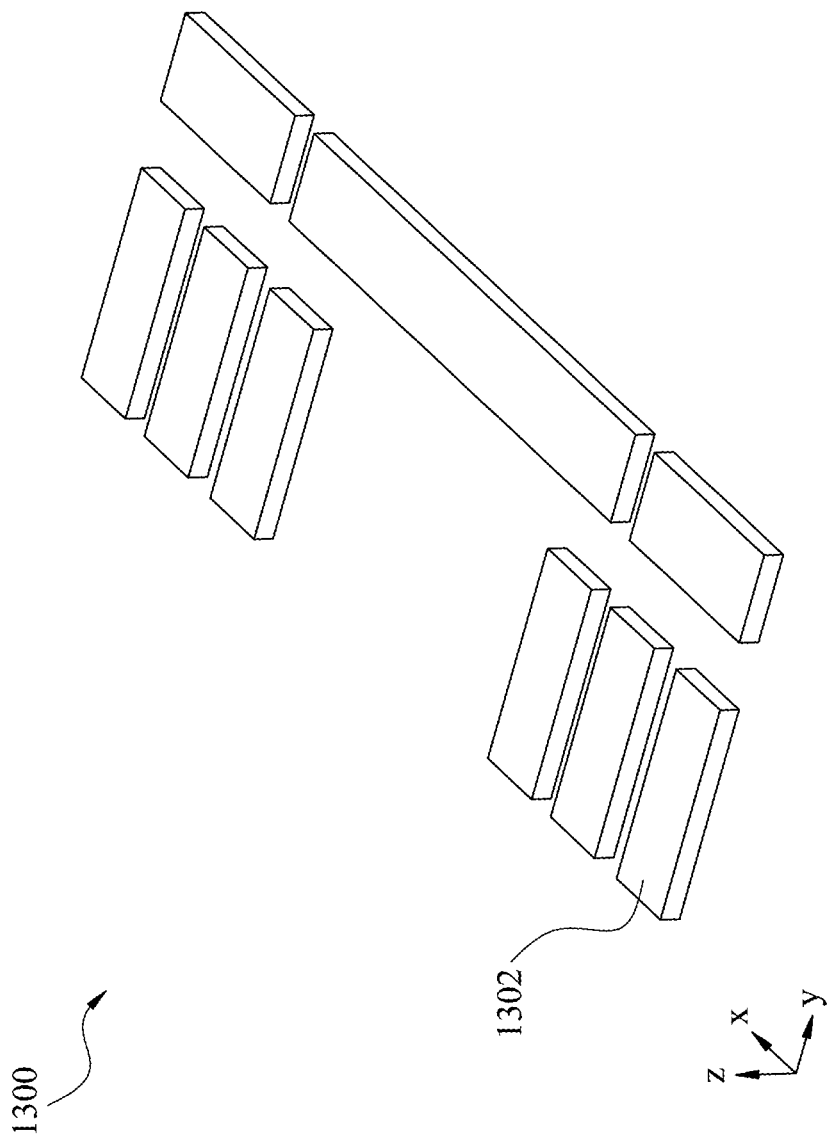
FIGS. 13, 14, 15, 16, 17, 18, 19, 20, and 21 each illustrate a perspective view of an example three-dimensional memory device test structure during various fabrication stages, made by the method of FIG. 12, in accordance with some embodiments.

Corresponding to operation 1202 of FIG. 12, FIG. 13 is a perspective view of the 3D memory device test structure 1300 including a plurality of bottom metal routings, in accordance with various embodiments.

A plurality of bottom interconnect structures 1302 (sometimes referred to as first lateral test interconnect structures or bottom metal routings) may be formed form a metallic material including at least one metal material such as, but not limited to, tungsten, copper, cobalt, ruthenium, titanium, tantalum, combinations thereof, or any other suitable material. The bottom interconnect structures 1302 can be formed by a conformal deposition method, which can be, for example, chemical vapor deposition (CVD), atomic layer deposition (ALD), electroless plating, electroplating, combinations thereof, or any other suitable method. The plurality of bottom metal interconnect structures may extend horizontally along the X-direction or the Y-direction and may be disposed along a bottom surface of the memory device test structure 1300, as shown in FIG. 13. In some embodiments, the plurality of bottom metal interconnect structures may comprise both horizontal portions and vertical portions extending along the Z-direction.

Figure 14:
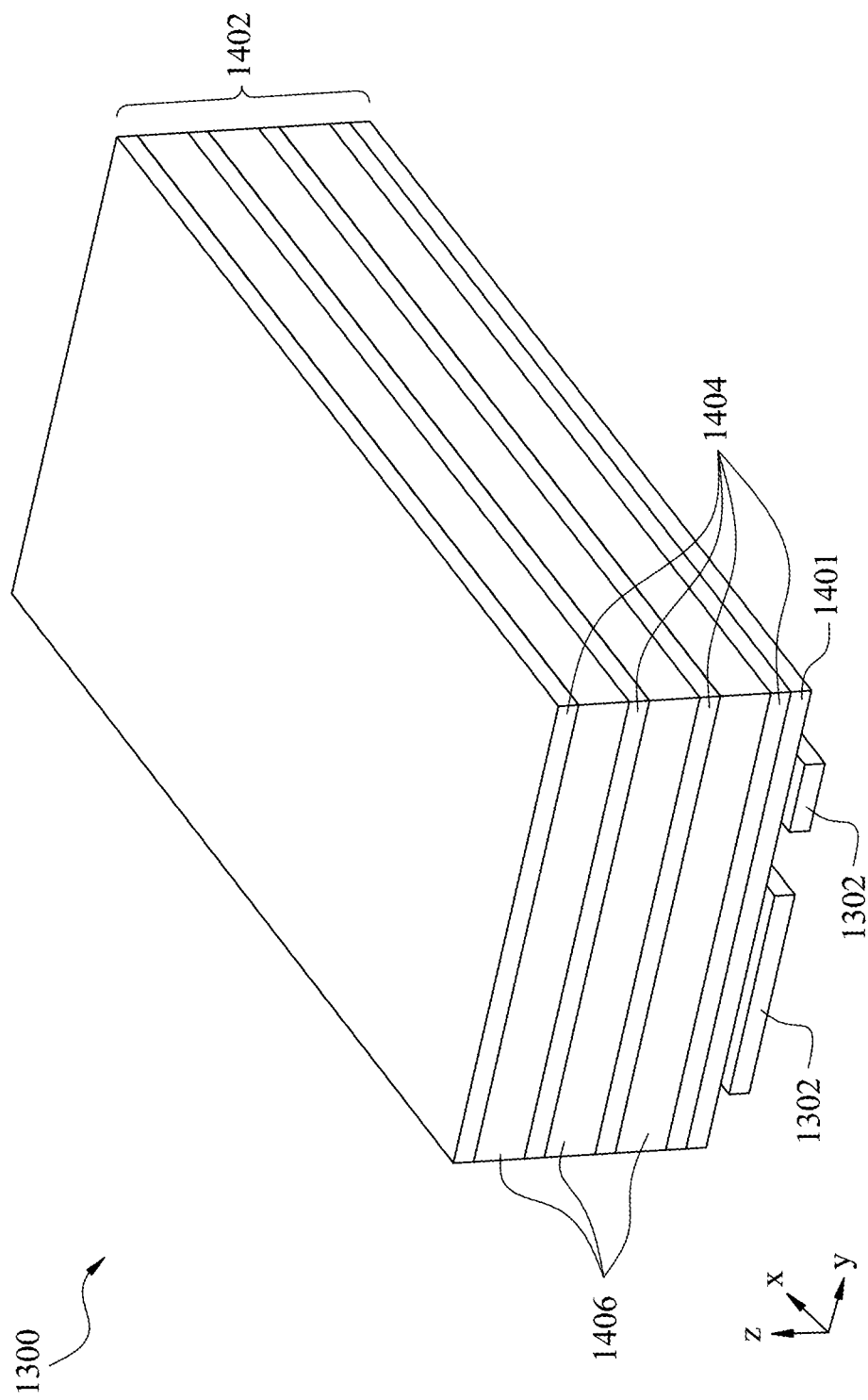

Corresponding to operation 1204 of FIG. 12, FIG. 14 is a perspective view of the 3D memory device test structure 1300 including a stack 1402 formed over a substrate 1401 disposed above the bottom interconnect structures 1302, at one of the various stages of fabrication, in accordance with various embodiments.

The semiconductor substrate 1401 may be a semiconductor substrate, such as a bulk semiconductor, a semiconductor-on-insulator (SOI) substrate, or the like, which may be doped (e.g., with a p-type or an n-type dopant) or undoped. The substrate 1401 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 1401 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof, or any other suitable material.

The stack 1402 includes a number of insulating layers 1404 and a number of sacrificial layers 1406 alternately stacked on top of one another over the substrate 1401 along a vertical direction (e.g., the Z direction). Although four insulating layers 1404 and three sacrificial layers 1406 are shown in the illustrated embodiment of FIG. 14, it should be understood that the stack 1402 can include any number of insulating layers and any number of sacrificial layers alternately disposed on top of one another, while remaining within the scope of the present disclosure. Further, although the stack 1402 directly contacts the substrate 1401 in the illustrated embodiment of FIG. 14, it should be understood that the stack 1402 is separated from the substrate 1401. As used herein, the alternately stacked insulating layers 1404 and sacrificial layers 1406 refer to each of the sacrificial layers 1406 being adjoined by two adjacent insulating layers 1406. The insulating layers 1404 may have the same thickness thereamongst, or may have different thicknesses. The sacrificial layers 1406 may have the same thickness thereamongst, or may have different thicknesses. In some embodiments, the stack 1402 may begin with the insulating layer 1404 (as shown in FIG. 14) or the sacrificial layer 1406.

The insulating layers 1404 can include at least one insulating material. The insulating materials that can be employed for the insulating layer 1404 include, but are not limited to, silicon oxide (including doped or undoped silicate glass), silicon nitride, silicon oxynitride, organosilicate glass (OSG), spin-on dielectric materials, dielectric metal oxides that are generally known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the insulating layers 1404 can be silicon oxide.

The sacrificial layers 1406 may include an insulating material, a semiconductor material, or a conductive material. The material of the sacrificial layers 1406 is a sacrificial material that can be subsequently removed selective to the material of the insulating layers 1404. Non-limiting examples of the sacrificial layers 1406 include silicon nitride, an amorphous semiconductor material (such as amorphous silicon), and a polycrystalline semiconductor material (such as polysilicon). In one embodiment, the sacrificial layers 1406 can be spacer material layers that include silicon nitride or a semiconductor material including at least one of silicon or germanium.

The stack 1402 can be formed by alternately depositing the respective materials of the insulating layers 1404 and sacrificial layers 1406 over the substrate 1401. In some embodiments, one of the insulating layers 1404 can be deposited, for example, by chemical vapor deposition (CVD), followed by depositing, for example, using CVD or atomic layer deposition (ALD), one of the sacrificial layers 1406.

Figure 15:
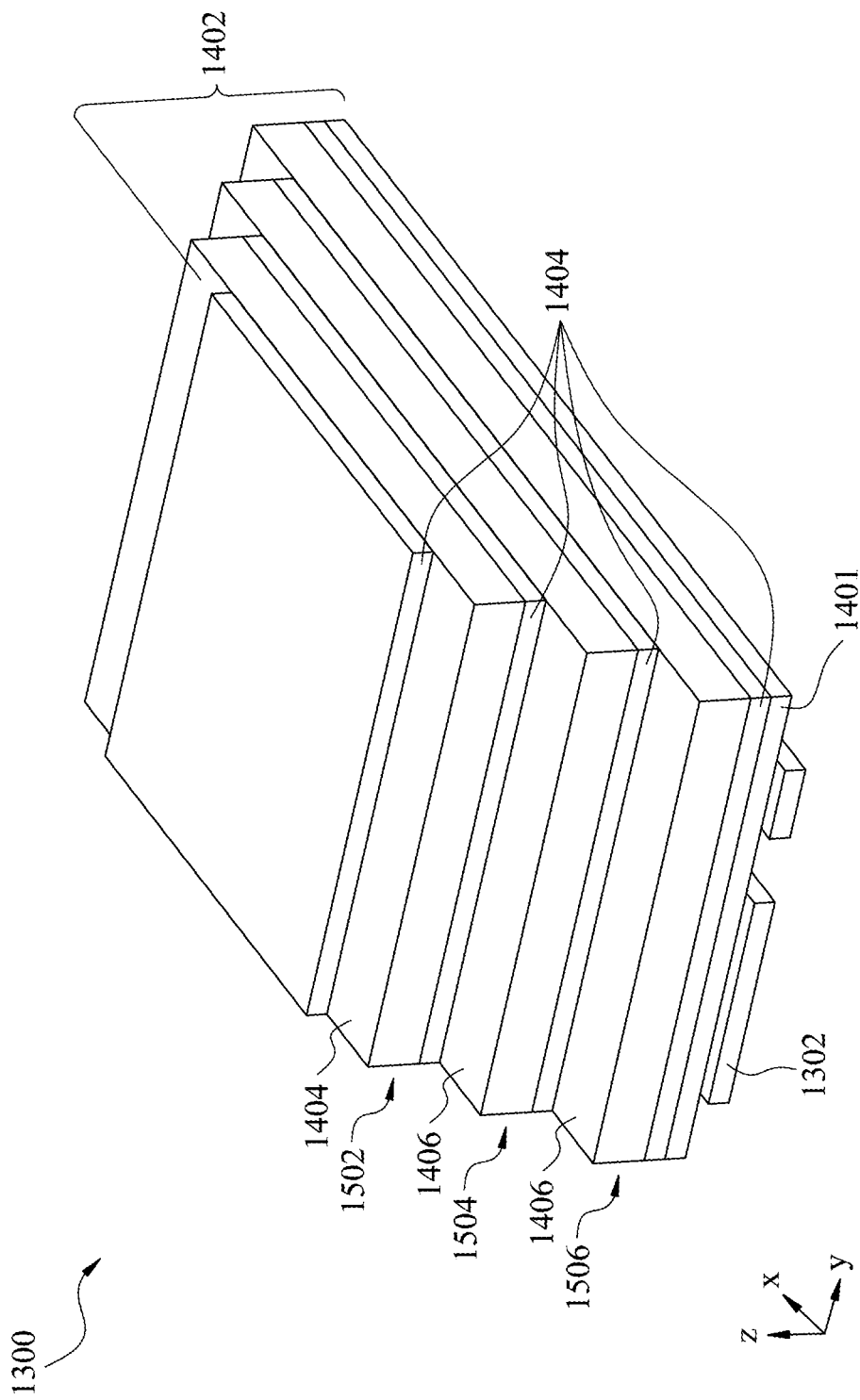

Corresponding to operation 1206 of FIG. 12, FIG. 15 is a perspective view of the 3D memory device test structure 1300 in which the stack 1402 is patterned to form a staircase profile at one of the various stages of fabrication, in accordance with various embodiments.

To form the staircase profile, a mask layer (not shown) is deposited on the stack (on the topmost insulating layer 1404), and is patterned. In some embodiments, the mask layer may include a photoresist (e.g., a positive photoresist or a negative photoresist), for example, a single layer or multiple layers of the same photoresist or different photoresists. In other embodiments, the mask layer may include a hard mask layer, for example, a polysilicon mask layer, a metallic mask layer, or any other suitable mask layer.

Next, the mask layer is patterned to etch portions of the mask layer at axial ends off the mask layer in the X-direction, for example, so as to reduce its axial width. The mask layer may be patterned using photolithography techniques. Generally, photolithography techniques utilize a photoresist material that forms the mask layer and that is deposited, irradiated (exposed), and developed to remove a portion of the photoresist material, in this instance, end portions of the mask layer. The remaining mask layer protects the underlying material, such as a portion of the stack 1402 below the patterned mask layer, from subsequent processing steps, such as etching.

Next, respective portions of the topmost insulating layer 1404 and the topmost sacrificial layer 1406 on both sides of the mask layer in the X-direction, are etched. For example, the patterned mask layer is used to etch the exposed portions of the topmost insulating layer 1404 and the topmost sacrificial layer 1406 so as to form a first step (or stair) 1502 (out of the topmost insulating layer 1404 and the sacrificial layer 1406) over the next lower insulating layer 1404 and sacrificial layer 1406 (i.e., the second topmost insulating layer 1404 and sacrificial layer 1406). In some embodiments, the etch may be an anisotropic etch (e.g., a reactive ion etch (RIE), neutral beam etch (NBE), deep reactive ion etch (DRIE), and the like, or combinations thereof), which selectively etches the exposed portions of the topmost insulating and sacrificial layers.

In some embodiments, the etching may include a first etch that selectively etches the topmost insulating layer 1404 until the underlying (e.g., topmost) sacrificial layer 1406 is exposed, and a second subsequent etch that etches the sacrificial layer 1406 until the underlying (e.g., second topmost) insulating layer 1404 is exposed. Such two-step etching process may allow the underlying sacrificial layer or the insulating layer to serve as a etch stop such that once a portion of the layer immediately above it has been removed, so as to prevent over-etching.

Next, the mask layer is again etched to reduce its axial width in the X-direction, followed by the two-step etching process to form a second step 1504 (out of the second topmost insulating layer 1404 and sacrificial layer 1406). By iteratively performing the width reduction process on the mask layer and the two-step etching process, the stack 1402 can be patterned to include a number of steps (e.g., steps 1502, 1504, and 1506), which results in the staircase profile as shown in FIG. 15.

Figure 16:
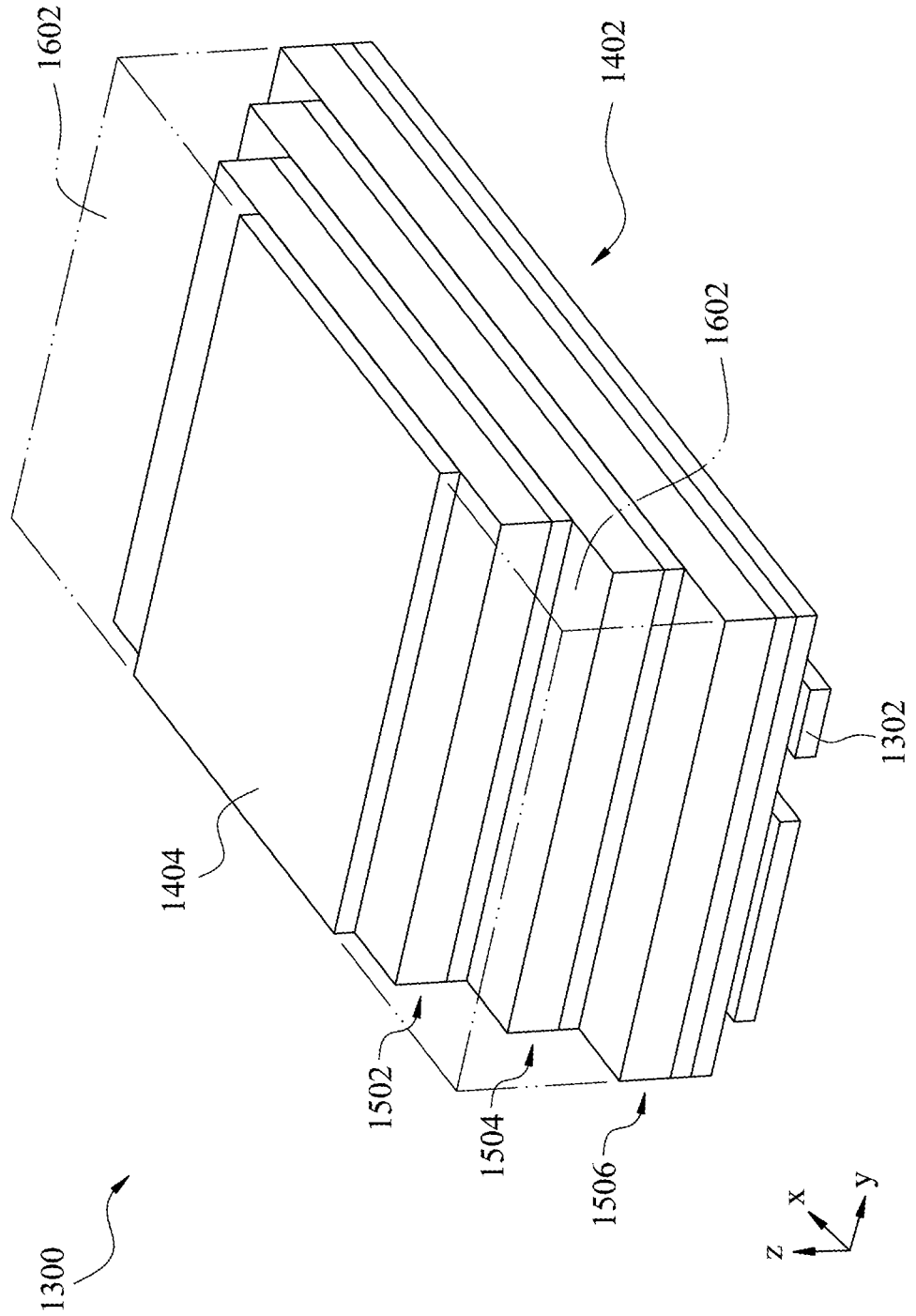

Corresponding to operation 1208 of FIG. 12, FIG. 16 is a perspective view of the 3D memory device test structure 1300 including an IMD 1602 formed over the stack 1402 (having the staircase profile) at one of the various stages of fabrication, in accordance with various embodiments.

The IMD 1602 can be formed by depositing a dielectric material in bulk over the partially formed 3D memory device test structure 1300, and polishing the bulk oxide back (e.g., using CMP) to the level off the topmost insulating layer 1404, such that the IMD 1602 is disposed only over the steps 1502 to 1506. The dielectric material of the IMD 1602 may include SiO, phosphosilicate glass (PSG), borosilicate glass (BSG), boron-doped phosphosilicate glass (BPSG), undoped silicate glass (USG), combinations thereof, or any other suitable material.

Figure 17:
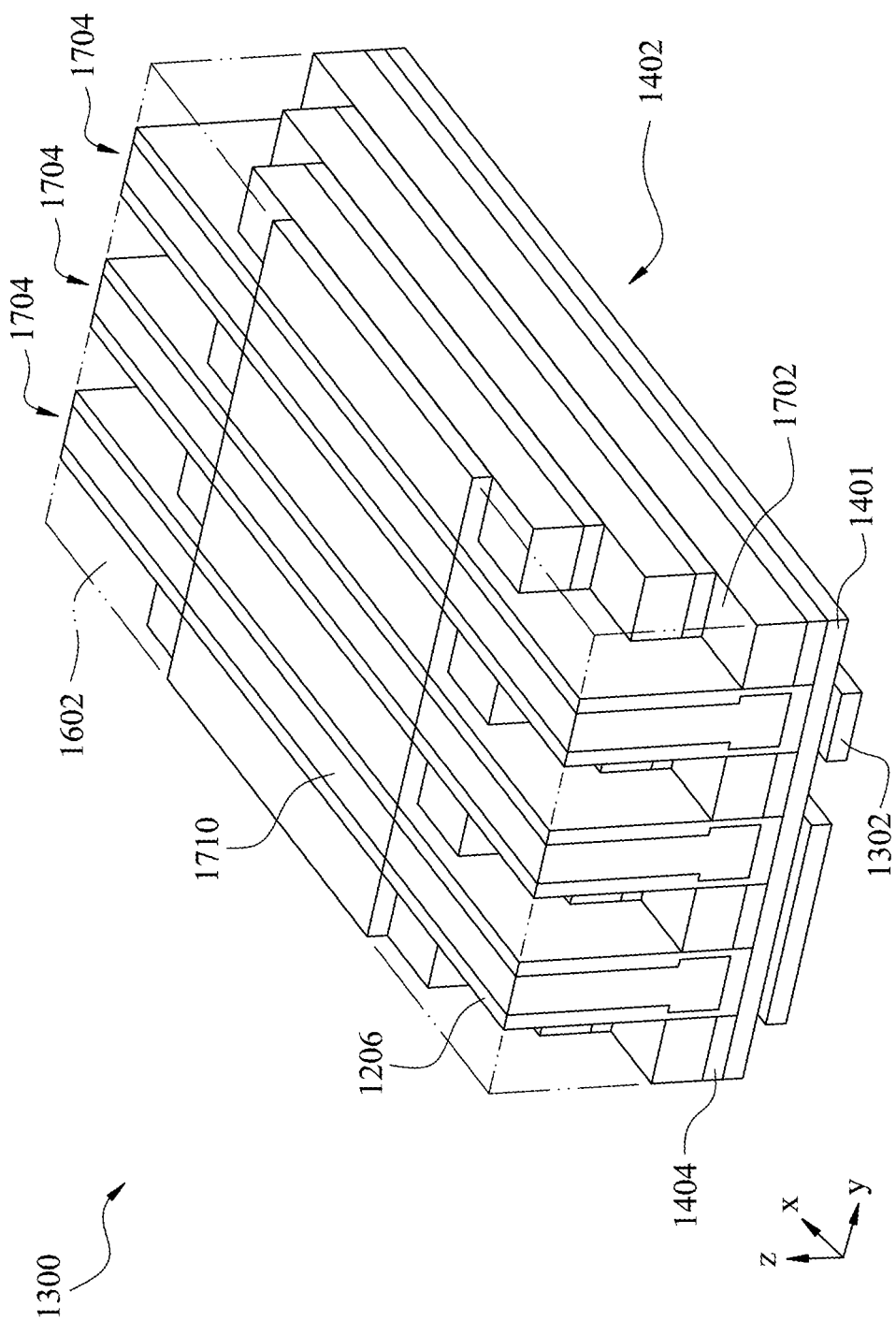

Corresponding to operation 1210 of FIG. 12, FIG. 17 is a perspective view of the 3D memory device test structure 1300 including a number of WLs 1702, at one of the various stages of fabrication, in accordance with various embodiments.

In some embodiments, a number of WL trenches 1704 (shown more clearly in FIG. 18 below) may be formed in the memory device test structure 1300. Although three WL trenches 1704 are formed in the illustrated embodiment of FIG. 17, it should be understood that the 3D memory device test structure 1300 can include any number of WL trenches, while remaining within the scope of the present disclosure. The WL trenches 1704 both extend along a lateral direction (e.g., the X direction). The WL trenches 1704 can be formed using one or more etching processes. The etching processes may each include, for example, a reactive ion etch (RIE) process, a neutral beam etch (NBE) process, combinations thereof, or any other suitable process. The etching processes may be anisotropic.

To form the WLs 1702 (sometimes referred to as control structures), each of the sacrificial layers 1406 may be laterally recessed (e.g., along the Y direction). The sacrificial layers 1406 can be recessed by performing an etching process that etches the sacrificial layers 1406 selective to the insulating layers 1404 through the WL trenches 1704. Alternatively stated, the insulating layers 1404 may remain substantially intact throughout the selective etching process. In some embodiments, each of the sacrificial layers 1406 may be inwardly recessed from its both ends (along the Y direction).

The etching process can include a wet etching process employing a wet etch solution, or can be a gas phase (dry) etching process in which the etchant is introduced in a vapor phase into the first trenches (dotted lines). In the example where the sacrificial layers 1406 include silicon nitride and the insulating layers 1404 include silicon oxide, the etching process can include a wet etching process in which the workpiece is immersed within a wet etch tank that includes phosphoric acid, which etches silicon nitride of the sacrificial layer 1406 selective to silicon oxide, silicon, and various other materials of the insulating layers 1404.

Next, a metallic fill layer can be (e.g., conformally) formed to fill the "recesses" inwardly with respect to the insulating layer 1404, thereby forming the WLs 1702, as shown in FIG. 17. The metallic fill layer may also be disposed on the sidewalls and bottom of the WL trenches 1704, as shown in FIG. 17, so as to form a metallic lining 1706 in the WL trenches 1704. The metallic fill layer includes at least one metal material such as, but not limited to, tungsten, copper, cobalt, ruthenium, titanium, tantalum, combinations thereof, or any other suitable material. The metallic fill layer can be deposited by a conformal deposition method, which can be, for example, chemical vapor deposition (CVD), atomic layer deposition (ALD), electroless plating, electroplating, combinations thereof, or any other suitable method.

In some embodiments, an insulating material 1710 (e.g., SiO, SiN, SiON, SiCN, SiC, SiOC, SiOCN, any other suitable material, combinations thereof) may then be formed in the WL trenches 1704 so as to fill the WL trench 1704. In some embodiments, the insulating material 1710 may be formed from the same material as the plurality of insulating layers 1404. The insulating material 1710 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof.

Figure 18:
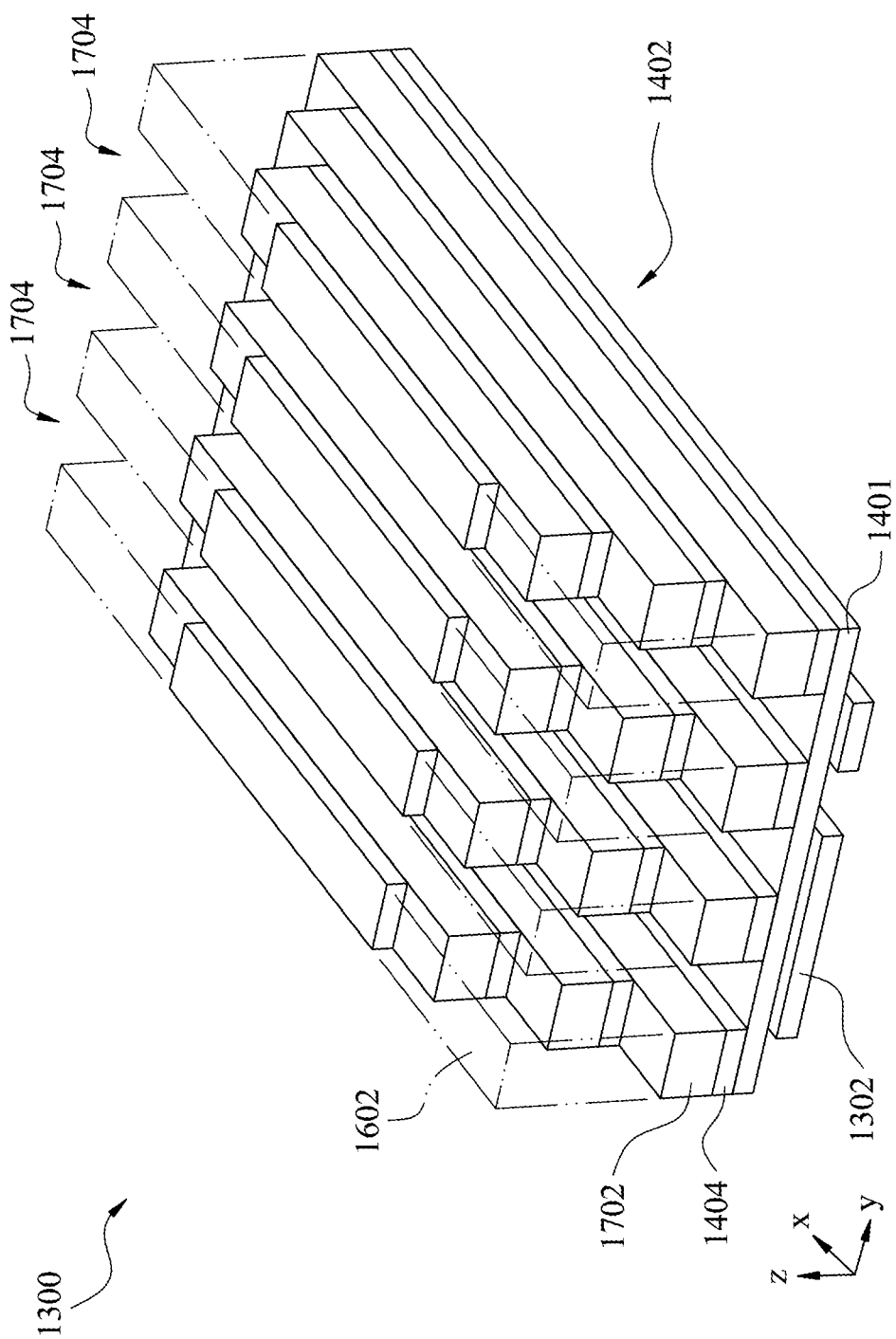

Also corresponding to operation 1210 of FIG. 12, FIG. 18 is a perspective view of the 3D memory device test structure 1300 including the WL trenches 1704 after etching the metallic lining 1706 and the insulating material 1710 at one of the various stages of fabrication, in accordance with various embodiments.

In some embodiments, the metallic lining 1706 and the insulating material 1710 (FIG. 17) in the WL trenches 1704 may then be removed by any suitable process such as a reactive ion etch (RIE) process, a neutral beam etch (NBE) process, combinations thereof, or any other suitable process. The metallic lining 1706 and the insulating material 1710 may be removed so as to form WL trenches 1704 and WLs 1702 laterally isolated from each other along the Y-direction.

Figure 19:
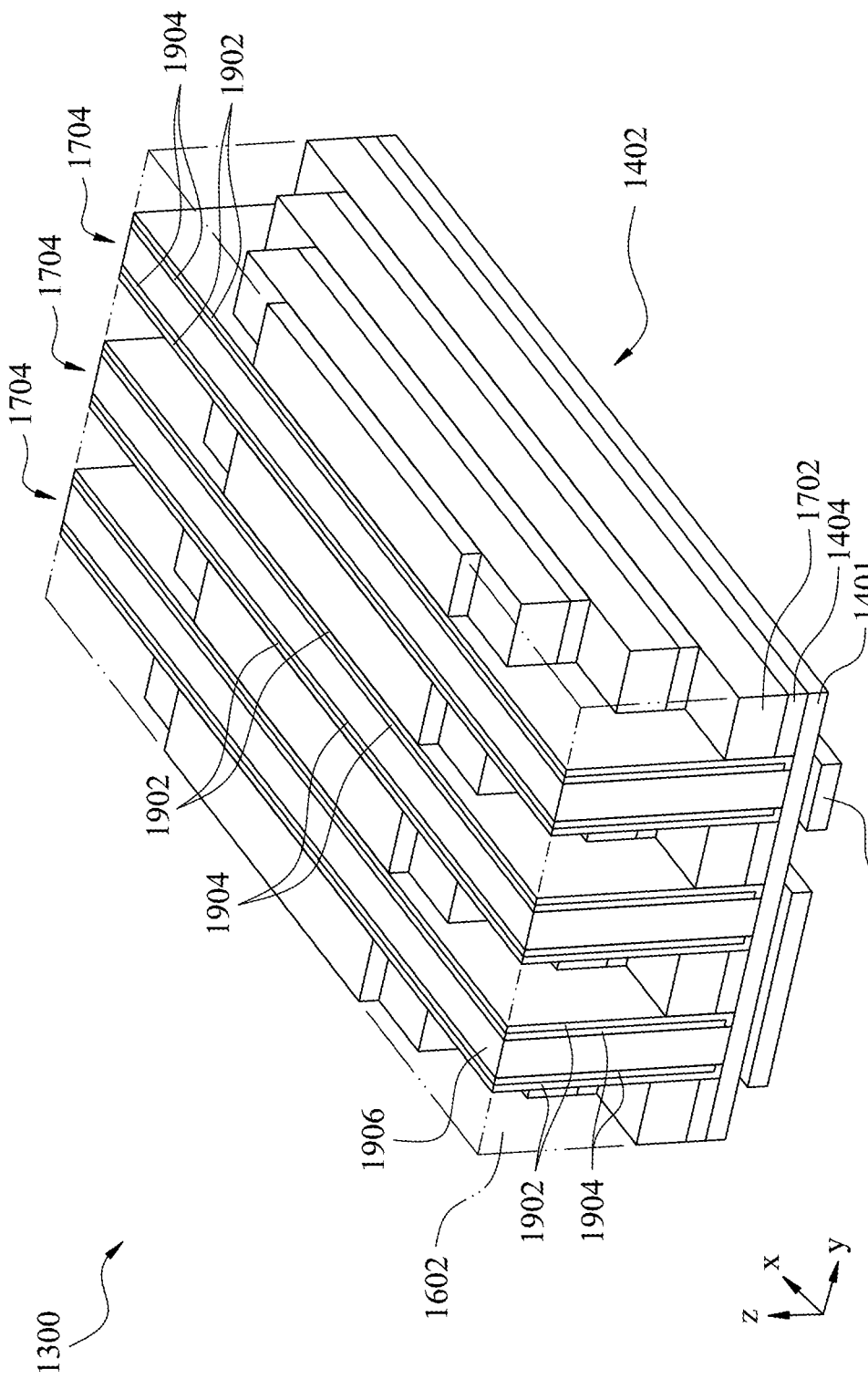

Corresponding to operation 1212 of FIG. 12, FIG. 19 is a perspective view of the 3D memory device test structure 1300 including a number of memory layers 1902 and a number of channel layers 1904 at one of the various stages of fabrication, in accordance with various embodiments.

In various embodiments, each of the memory layers 1902 includes two portions, each of which is formed to extend along one of the sidewalls of a corresponding trench. As such, each portion of the memory layer is in contact with a corresponding number of WLs (through their respective exposed sidewalls). Over the memory layer, each of the channel layers 1904 also includes two portions that are in contact with the two portions of a corresponding memory layer 1902, respectively. As shown in the illustrated example of FIG. 19, the memory layers 1902, including two portions, and the channel layers 1904, including two portions, are formed in the trenches 1704.

Each of the memory layers 1902, disposed along sidewalls of each of the WL trenches 1704, may include a ferroelectric material, for example, lead zirconate titanate (PZT), $PbZr/TiO_3$, $BaTiO_3$, $PbTiO_2$, etc. However, it should be understood that the memory layers 1902 may each include a charge storage layer, while remaining within the scope of the present disclosure. The memory layers 1902 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the memory layers are each continuous around the sidewalls of the WL trench.

Each of the channel layers 1904 is formed on inner surfaces (sidewalls) of the memory layer. In some embodiments, the channel layers 1904 may each be formed from a semiconductor material, for example, Si (e.g., polysilicon or amorphous silicon), Ge, SiGe, silicon carbide (SiC), etc. The channel layers 1904 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the channel layers 1904 are each continuous on the inner surfaces of the memory layer.

Each of the WL trenches 1704 is then filled with an insulating material (e.g., SiO, SiN, SiON, SiCN, SiC, SiOC, SiOCN, any other suitable material, combinations thereof) so as to form an inner spacer (or a dielectric strip) 1906. In some embodiments, the inner spacer 1906 may be formed from the same material as the plurality of insulating layers 1404. The inner spacer 1906 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof.

Figure 20:
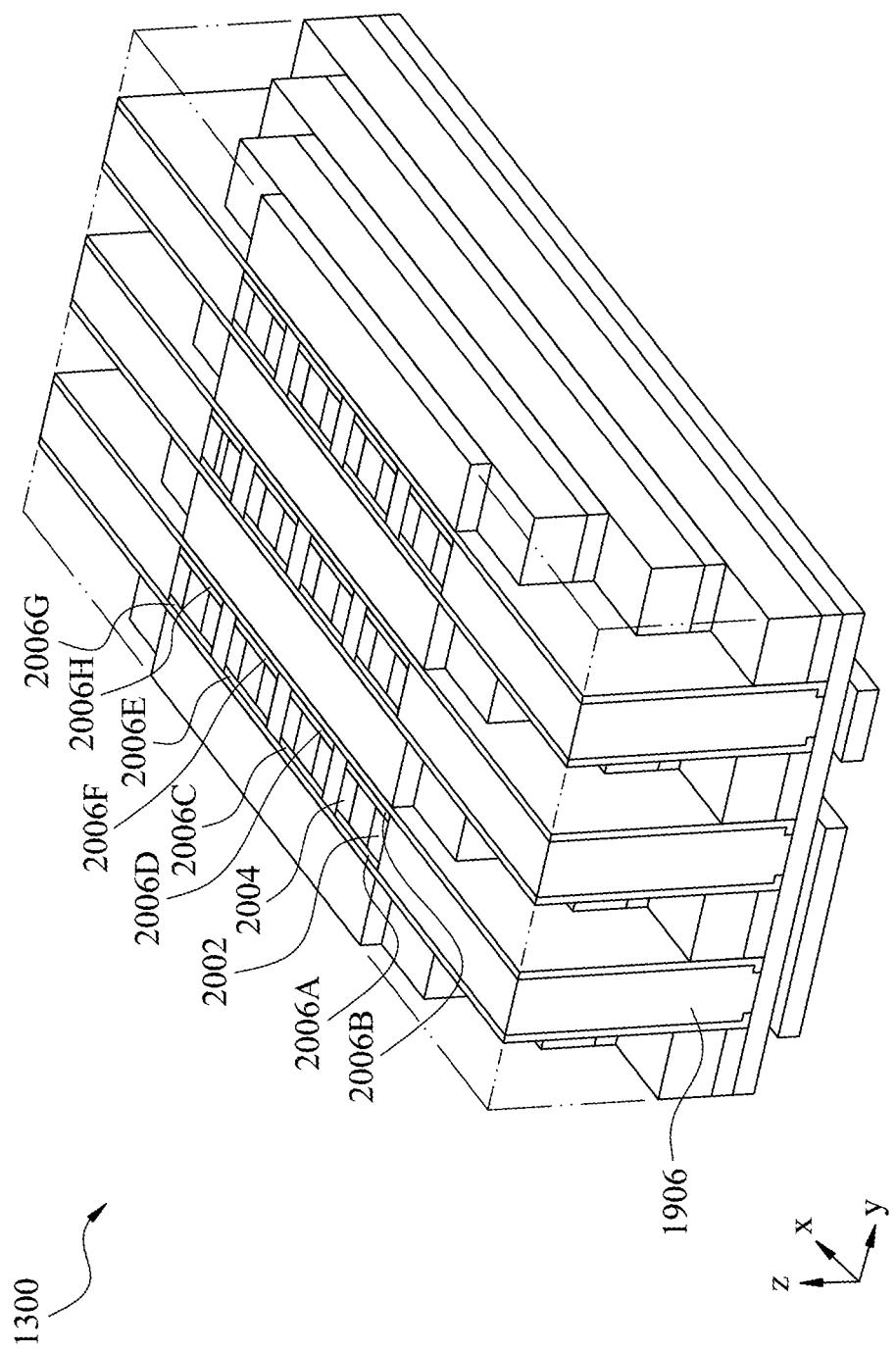

Corresponding to operation 1214 of FIG. 12, FIG. 20 is a perspective view of the 3D memory device test structure 1300 in which the channel layers 1904 are each patterned and the BLs 2002 and SLs 2004 are formed at one of the various stages of fabrication, in accordance with various embodiments.

In some embodiments, each of the channel layers 1904 is patterned into a number of segments, each of which can define the initial footprint of a memory string. For example, the channel layer 1904 is patterned into discrete segments 2006A, 2006B, 2006C, 2006D, 2006E, 2006F, 2006G, and 2006H. Each of such channel segments can serve as the channel of a memory string that includes a number of memory cells disposed across multiple tiers. Hereinafter, channel segments 2006A-H are referred to as "memory strings 2006A to 2006H." The segments are electrically isolated from one another by refilling an insulating material (e.g., SiO, SiN, SiON, SiCN, SiC, SiOC, SiOCN, any other suitable material, or combinations thereof).

In some embodiments, each of the BLs 2002 and SLs 2004 is formed of a metallic fill material, and extends along the Z direction. Each of the channel segments (or memory strings) is coupled to a pair of BL and SL. Further, two memory strings in a WL trench that face to each other can share a pair of BL and SL. Using the memory strings 2006A and 2006B as a representative example, the memory strings 2006A and 2006B share the vertically extending BL 2002 and SL 2004. The metallic fill layer includes at least one metal material such as, but not limited to, tungsten, copper, cobalt, ruthenium, titanium, tantalum, combinations thereof, or any other suitable material. The metallic fill layer can be deposited by a conformal deposition method, which can be, for example, chemical vapor deposition (CVD), atomic layer deposition (ALD), electroless plating, electroplating, combinations thereof, or any other suitable method.

Figure 21:
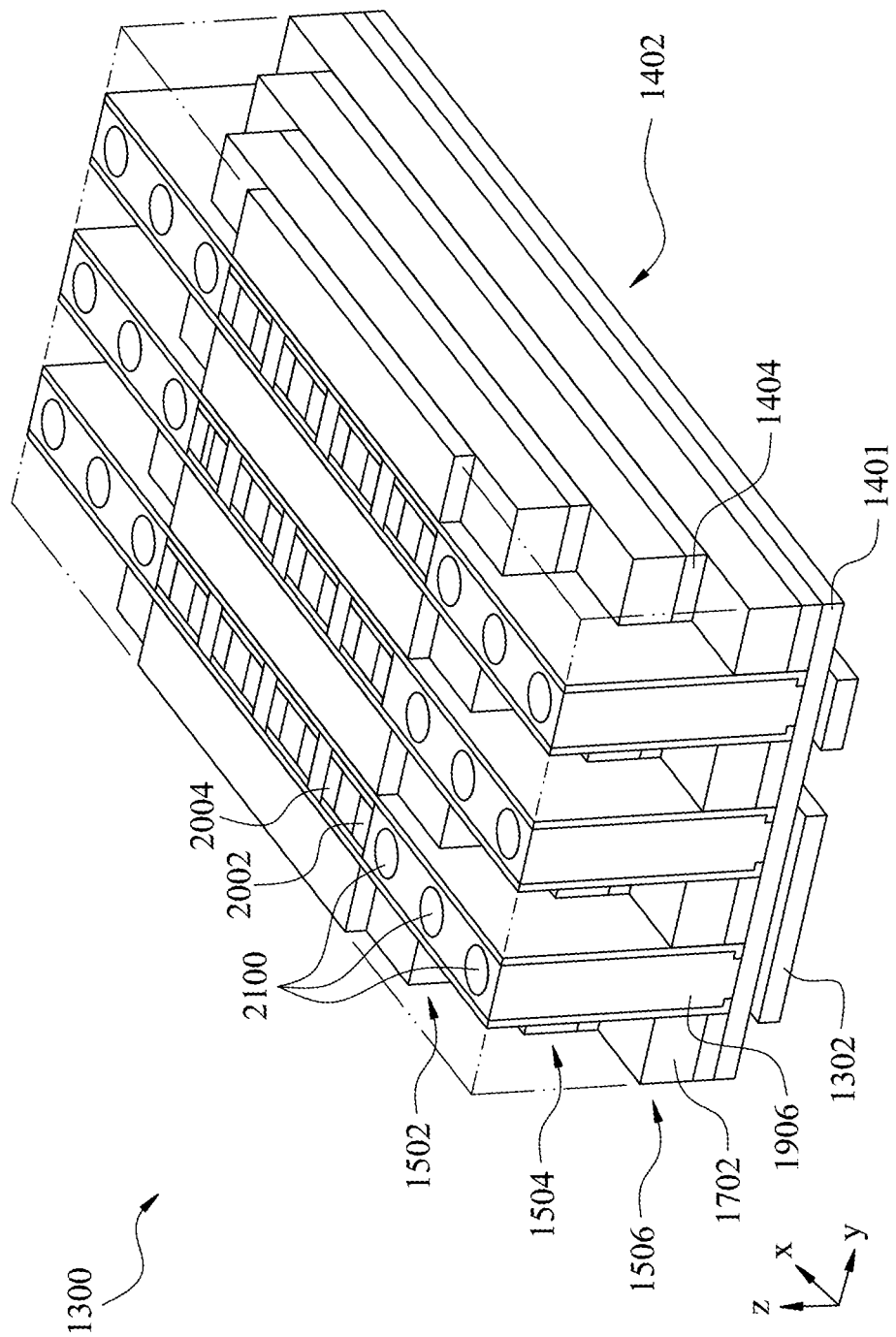

Corresponding to operation 1216 of FIG. 12, FIG. 21 is a perspective view of the 3D memory device test structure 1300 including a number of test interconnect structures 2100 at one of the various stages of fabrication, in accordance with various embodiments.

The test interconnect structures 2100 (substantially similar as the test interconnect structures 608A and 608B, as discussed above) each penetrate through the inner spacers 1906 and the substrate 1401 (i.e., the memory device test structure 1300) to land on a bottom interconnect structures 1302. Further, a subset of the test interconnect structures 2100 are interposed between two corresponding subsets of stairs or steps. For example in FIG. 21, a number of test interconnect structures 2100 vertically extending to land on the respective bottom interconnect structures 1302 are interposed between a first subset of steps 1502 to 1506 and a second subset of steps 1502 to 1506; a number of test interconnect structures 2100 vertically extending to land on the respective bottom interconnect structures 1302 are interposed between the second subset of steps 1502 to 1506 and a third subset of steps 1502 to 1506; and a number of test interconnect structures 2100 vertically extending to land on the respective bottom interconnect structures 1302 are interposed between the third subset of steps 1502 to 1506 and a fourth subset of steps 1502 to 1506. Each of such subsets of steps, having its steps arranged on top of one another with a lower one extending farther than an upper one along the X-direction, can form a sub-staircase profile, as shown in the illustrated embodiment of FIG. 21. In some embodiments, the test interconnect structures 2100 all have the same height or substantially the same height.

The test interconnect structures 2100 are formed by etching the inner spacers 1906 and the substrate 1401 to form a number of openings that expose the bottom interconnect structures 1302, and then filled out with the openings with a metallic fill material. The metallic fill material includes at least one metal material such as, but not limited to, tungsten, copper, cobalt, ruthenium, titanium, tantalum, combinations thereof, or any other suitable material. The metallic fill material can be deposited by a conformal deposition method, which can be, for example, chemical vapor deposition (CVD), atomic layer deposition (ALD), electroless plating, electroplating, combinations thereof, or any other suitable method.

Figure 22:
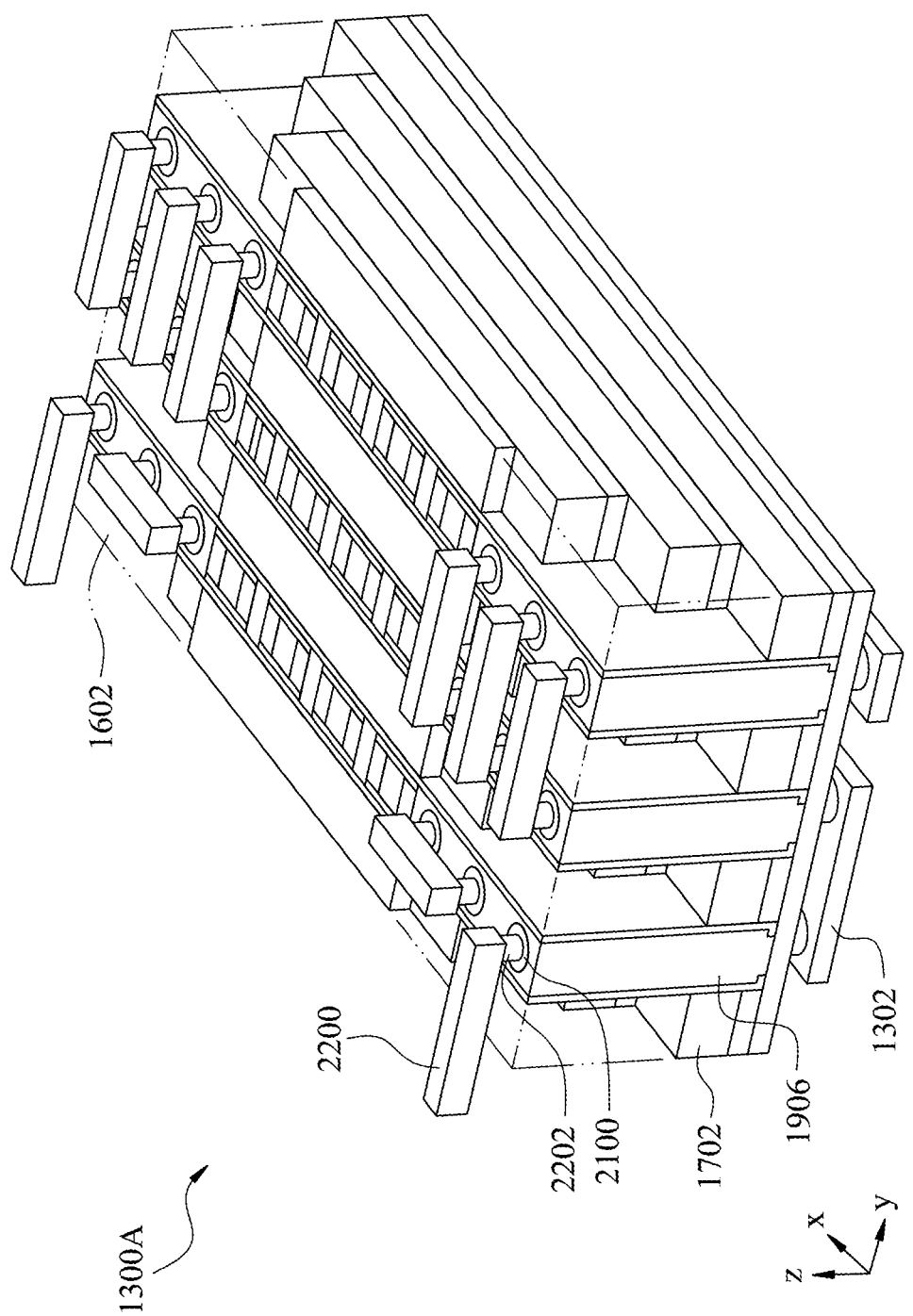
FIGS. 22-23 illustrate perspective views of various components of the three-dimensional memory device test structure of FIGS. 13-21, in accordance with some embodiments.
Figure 23:
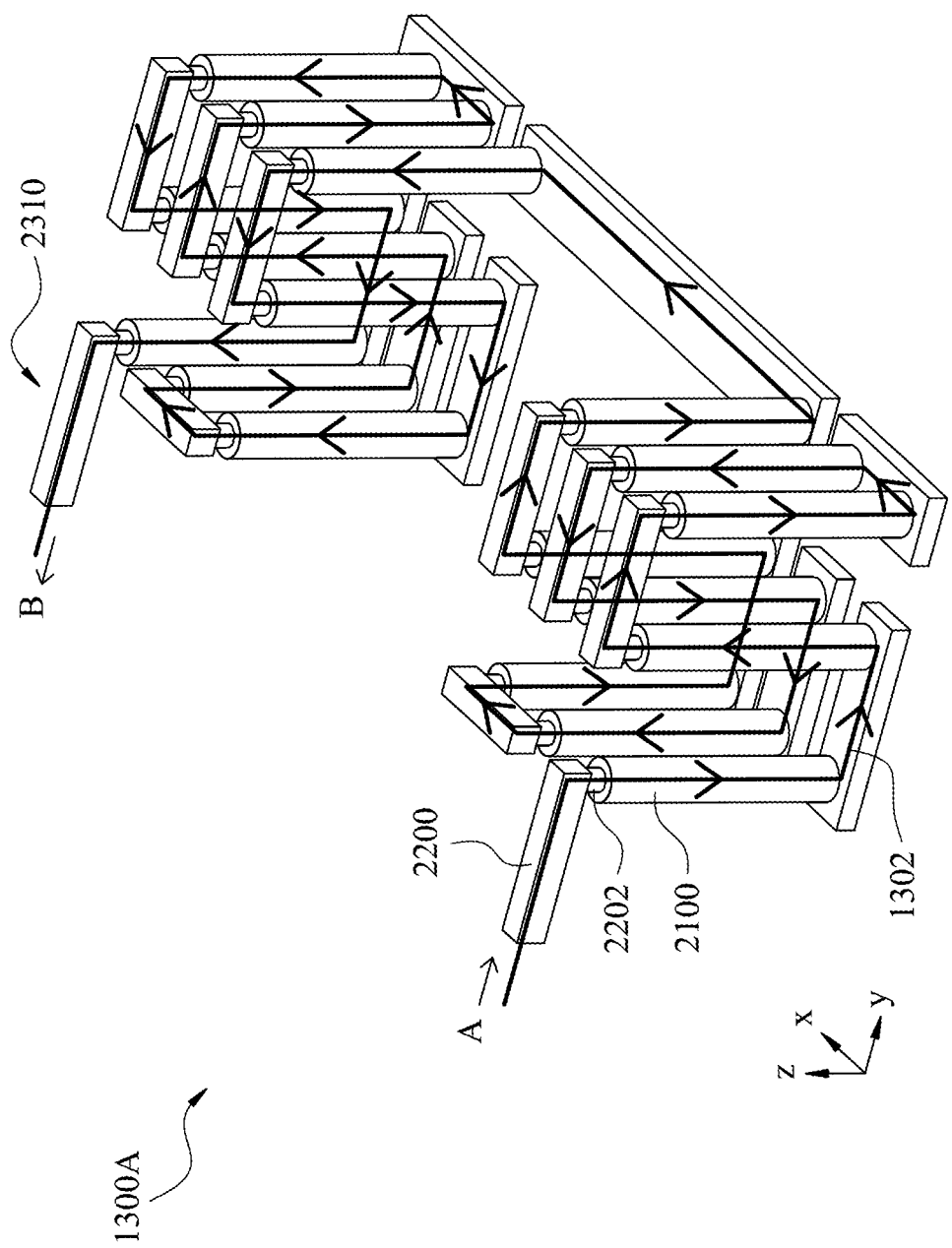

Corresponding to operation 1218 of FIG. 12, FIGS. 22-23 are perspective views of the 3D memory device test structure 1300A (a first embodiment of the 3D memory device test structure 1300) including a number of metal routings 2200 at one of the various stages of fabrication, in accordance with various embodiments.

The metal routings 2200 (substantially similar as the metal routings 610, as discussed above, and sometimes referred to as second lateral test interconnect structures) electrically couple the test interconnect structures 2100 in series. The metal routings 2200 may be disposed along a top surface of the memory device test structure 1300A. Further, each of the metal routings 2200, formed as a horizontal conductive line, is coupled to a respective test interconnect structure through a top via 2202 (e.g., top interconnect structure), formed as a vertical conductive line. Such metal routings 2200 and top vias 2202 may be formed through a dual-damascene or single-damascene process by forming one or more horizontal and vertical trenches extending through another IMD over the IMD 1602 and the inner spacers 1906, and filling those trenches with a metallic fill material. The metallic fill material includes at least one metal material such as, but not limited to, tungsten, copper, cobalt, ruthenium, titanium, tantalum, combinations thereof, or any other suitable material. The metallic fill material can be deposited by a conformal deposition method, which can be, for example, chemical vapor deposition (CVD), atomic layer deposition (ALD), electroless plating, electroplating, combinations thereof, or any other suitable method. In the illustrated examples of FIG. 18 (and FIGS. 19-22), the recesses are each formed with an edge-based sidewall (e.g., a nearly vertical sidewall), which causes the WLs 1702 to follow such an edge-based inner sidewall. However, the recessed may be formed to have a curvature-based sidewall, which causes the WLs 1702 to follow such a curvature-based inner sidewall.

In some embodiments, the top via 2202 and metal routing 2200 are formed with a width (extending along the Y direction) less than a width of the test interconnect structure 2100 (extending along the Y direction). The top via 2202 may have a bottom surface aligned with a top surface of the test interconnect structure 2100; the top via 2202 may have a bottom surface below a top surface of the test interconnect structure; the top via 2202 and the test interconnect structure 2100 may be centrally aligned with each other; or the top via 2202 and the test interconnect structure 2100 may be centrally misaligned with each other.

FIG. 23 illustrates a conduction path 2310 formed by using the metal routings 2200 and top vias 2202 to serially connecting the test interconnect structures 2100 to the test bottom interconnect structures 1302. A first signal (e.g., a voltage signal) may be applied to one end of the 3D memory device test structure 1300A (arrow "A" indicated in FIG. 23), the level of a second signal (e.g., a current signal) detected on the other end of the 3D memory device test structure 1300A (arrow "B" indicated in FIG. 23) can be used to determine whether one or more open circuits are present along the conduction path 2310. For example, if there is an open circuit present along the conduction path 2310, the level of the second signal may be lower than a threshold. The threshold can be pre-calibrated based on various process parameters (e.g., the resistivity of a material of the test interconnect structures 2100, a number of the test interconnect structures 2100, etc.). On the other hand, if there is no open circuit present, the level of the second signal should be equal to or greater than the threshold.

Figure 24:
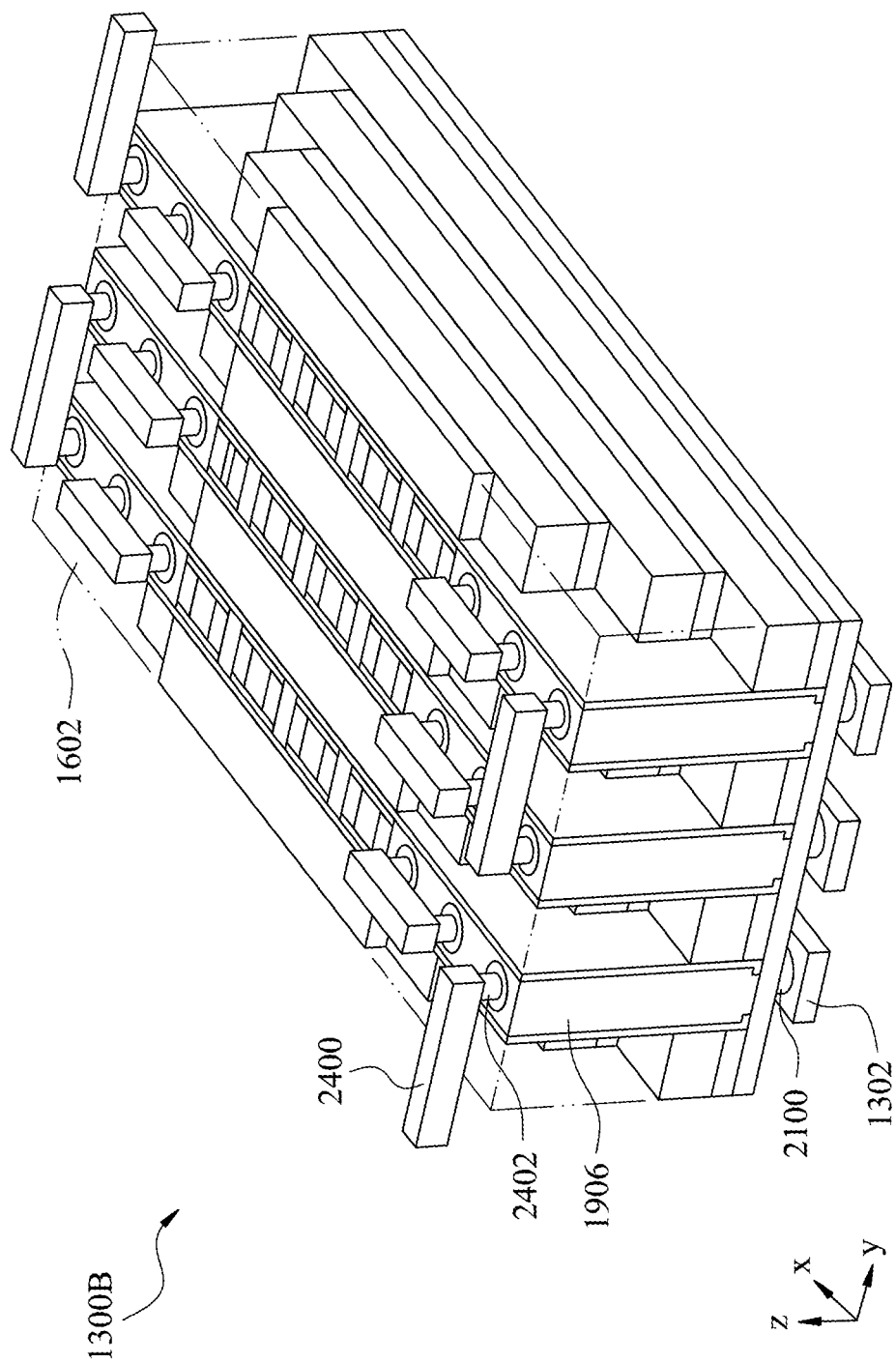
FIGS. 24-25 illustrate perspective views of various components of the three-dimensional memory device test structure of FIGS. 13-21, in accordance with some embodiments.
Figure 25:
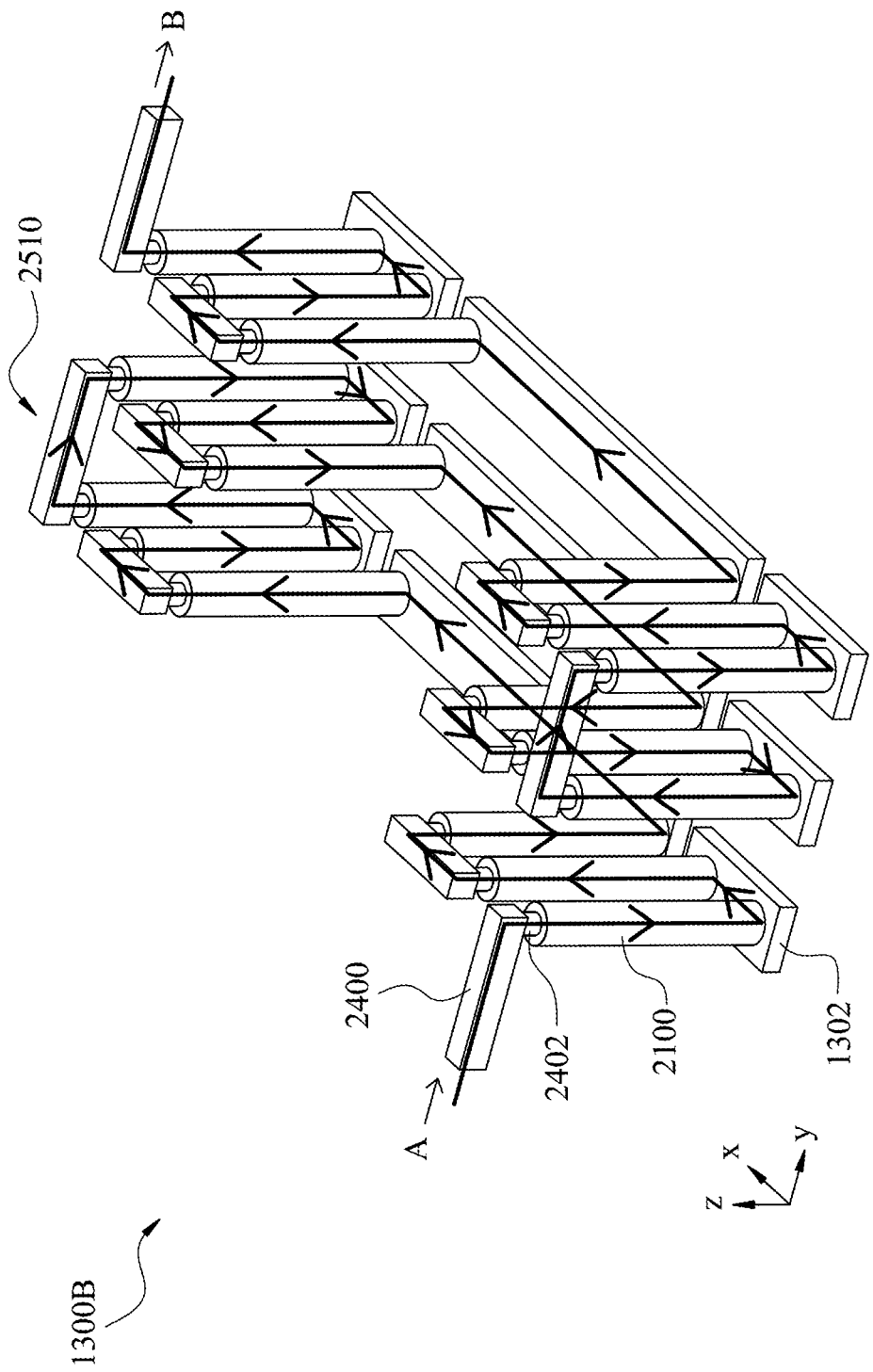

Also corresponding to operation 1218 of FIG. 12, FIGS. 24-25 are perspective views of the 3D memory device test structure 1300B (a second embodiment of the 3D memory device test structure 1300) including a number of metal routings 2400, in accordance with various embodiments.

The metal routings 2400 electrically couple the test interconnect structures 2100 in series. The metal routings 2400 are similar to the metal routings 2200 but are formed in to direct the electrical current through a different conduction path. Each of the metal routings 2400, formed as a horizontal conductive line, is coupled to a respective test interconnect structure through a top via, 2402, formed as a vertical conductive line. Such metal routings 2400 and top vias 2402 may be formed through a dual-damascene or single-damascene process by forming one or more horizontal and vertical trenches extending through another IMD over the IMD 1602, and filling those trenches with a metallic fill material, as shown in FIG. 24. The metallic fill material includes at least one metal material such as, but not limited to, tungsten, copper, cobalt, ruthenium, titanium, tantalum, combinations thereof, or any other suitable material. The metallic fill material can be deposited by a conformal deposition method, which can be, for example, chemical vapor deposition (CVD), atomic layer deposition (ALD), electroless plating, electroplating, combinations thereof, or any other suitable method.

FIG. 25 illustrates a conduction path 2510 formed by using the metal routings 2400 and top vias 2402 to serially connecting the test interconnect structures 2100 to the test bottom interconnect structures 1302. A first signal (e.g., a voltage signal) may be applied to one end of the 3D memory device test structure 1300B (arrow "A" indicated in FIG. 25), the level of a second signal (e.g., a current signal) detected on the other end of the 3D memory device test structure 1300B (arrow "B" indicated in FIG. 25) can be used to determine whether one or more open circuits are present along the conduction path 2510. For example, if there is an open circuit present along the conduction path 2510, the level of the second signal may be lower than a threshold. The threshold can be pre-calibrated based on various process parameters (e.g., the resistivity of a material of the test interconnect structures 2100, a number of the test interconnect structures 2100, etc.). On the other hand, if there is no open circuit present, the level of the second signal should be equal to or greater than the threshold. The metal routings 2400 provide a different conduction path than the one formed from the metal routings 2200 (FIG. 22) and can therefore test the second interconnect structures of the tested memory block in a different manner.

Figure 26:
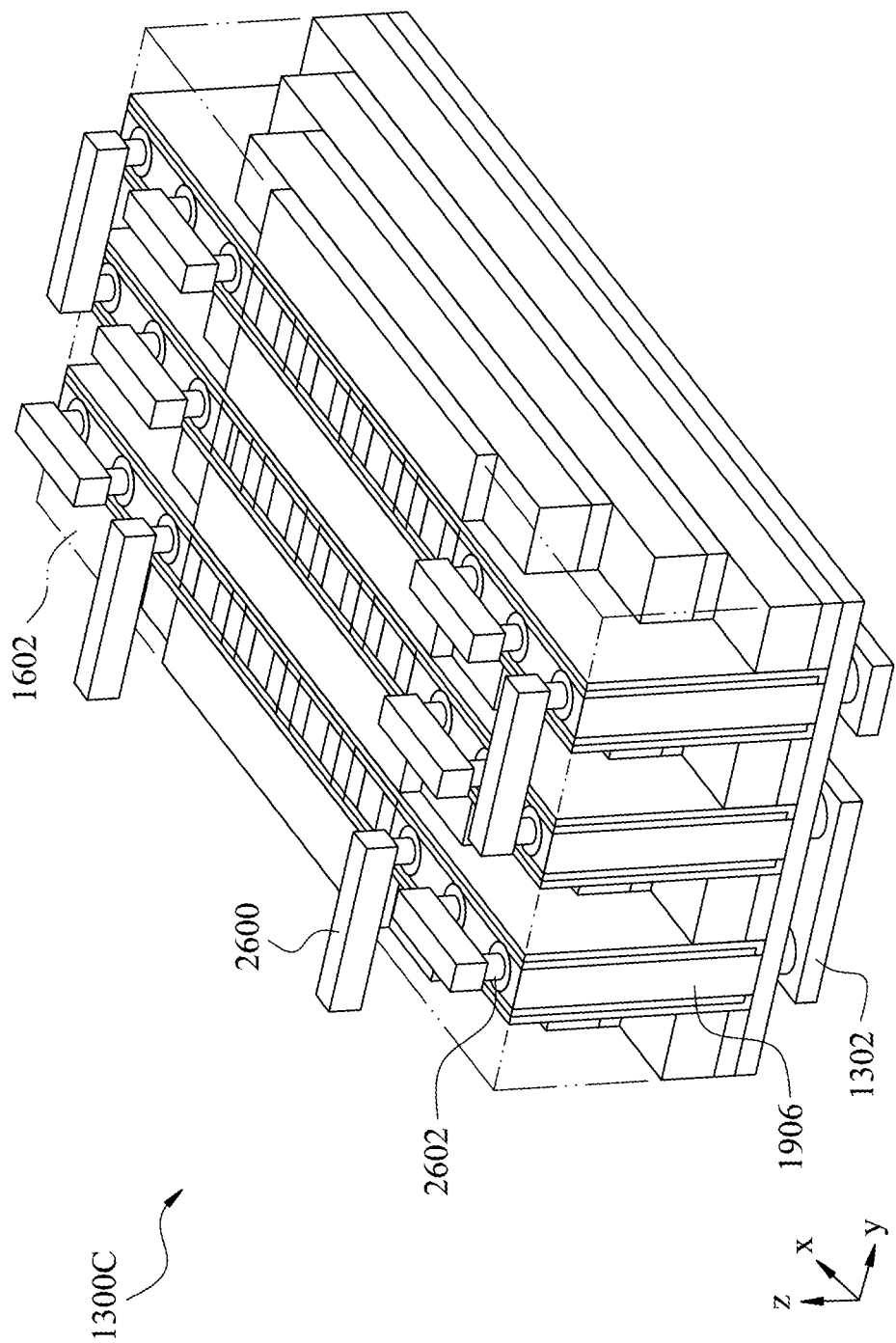
FIGS. 26-27 illustrate perspective views of various components of the three-dimensional memory device test structure of FIGS. 13-21, in accordance with some embodiments.
Figure 27:
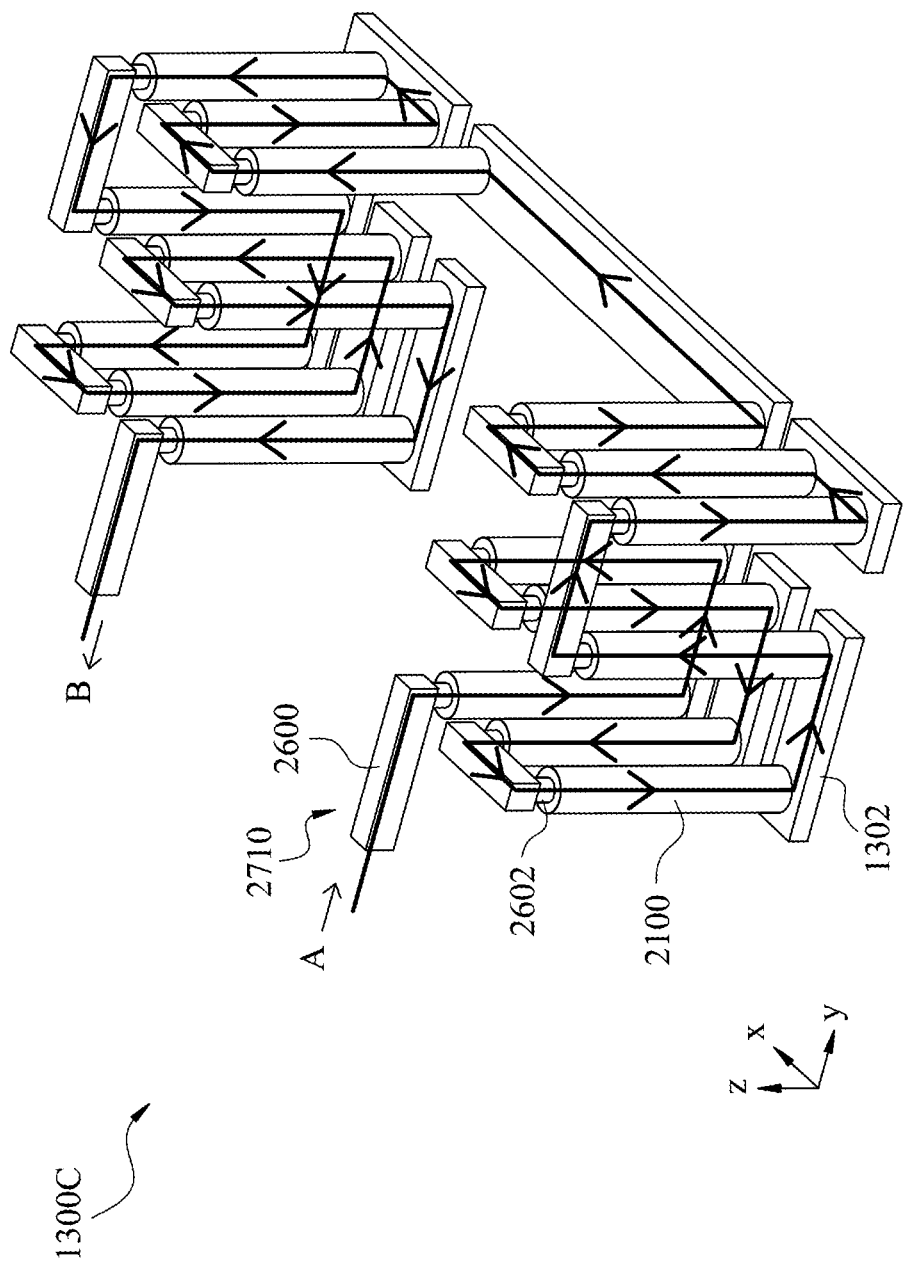

Also corresponding to operation 1218 of FIG. 12, FIGS. 26-27 are perspective views of the 3D memory device test structure 1300C (a third embodiment of the 3D memory device test structures 1300) including a number of metal routings 2600, in accordance with various embodiments.

The metal routings 2600 electrically couple the test interconnect structures 2100 in series. The metal routings 2600 are similar to the metal routings 2200 but are formed in to direct the electrical current through a different conduction path. Each of the metal routings 2600, formed as a horizontal conductive line, is coupled to a respective test interconnect structure through a top via, 2602, formed as a vertical conductive line. Such metal routings 2600 and top vias 2602 may be formed through a dual-damascene or single-damascene process by forming one or more horizontal and vertical trenches extending through another IMD over the IMD 1602, and filling those trenches with a metallic fill material, as shown in FIG. 26. The metallic fill material includes at least one metal material such as, but not limited to, tungsten, copper, cobalt, ruthenium, titanium, tantalum, combinations thereof, or any other suitable material. The metallic fill material can be deposited by a conformal deposition method, which can be, for example, chemical vapor deposition (CVD), atomic layer deposition (ALD), electroless plating, electroplating, combinations thereof, or any other suitable method.

FIG. 27 illustrates a conduction path 2710 formed by using the metal routings 2600 and top vias 2602 to serially connecting the test interconnect structures 2100 to the test bottom interconnect structures 1302. A first signal (e.g., a voltage signal) may be applied to one end of the 3D memory device test structure 1300C (arrow "A" indicated in FIG. 27), the level of a second signal (e.g., a current signal) detected on the other end of the 3D memory device test structure 1300C (arrow "B" indicated in FIG. 27) can be used to determine whether one or more open circuits are present along the conduction path 2710. For example, if there is an open circuit present along the conduction path 2710, the level of the second signal may be lower than a threshold. The threshold can be pre-calibrated based on various process parameters (e.g., the resistivity of a material of the test interconnect structures 2100, a number of the test interconnect structures 2100, etc.). On the other hand, if there is no open circuit present, the level of the second signal should be equal to or greater than the threshold. The metal routings 2600 provide a different conduction path than the one formed from the metal routings 2200 (FIG. 22) and can therefore test the second interconnect structures of the tested memory block in a different manner.

Figure 28:
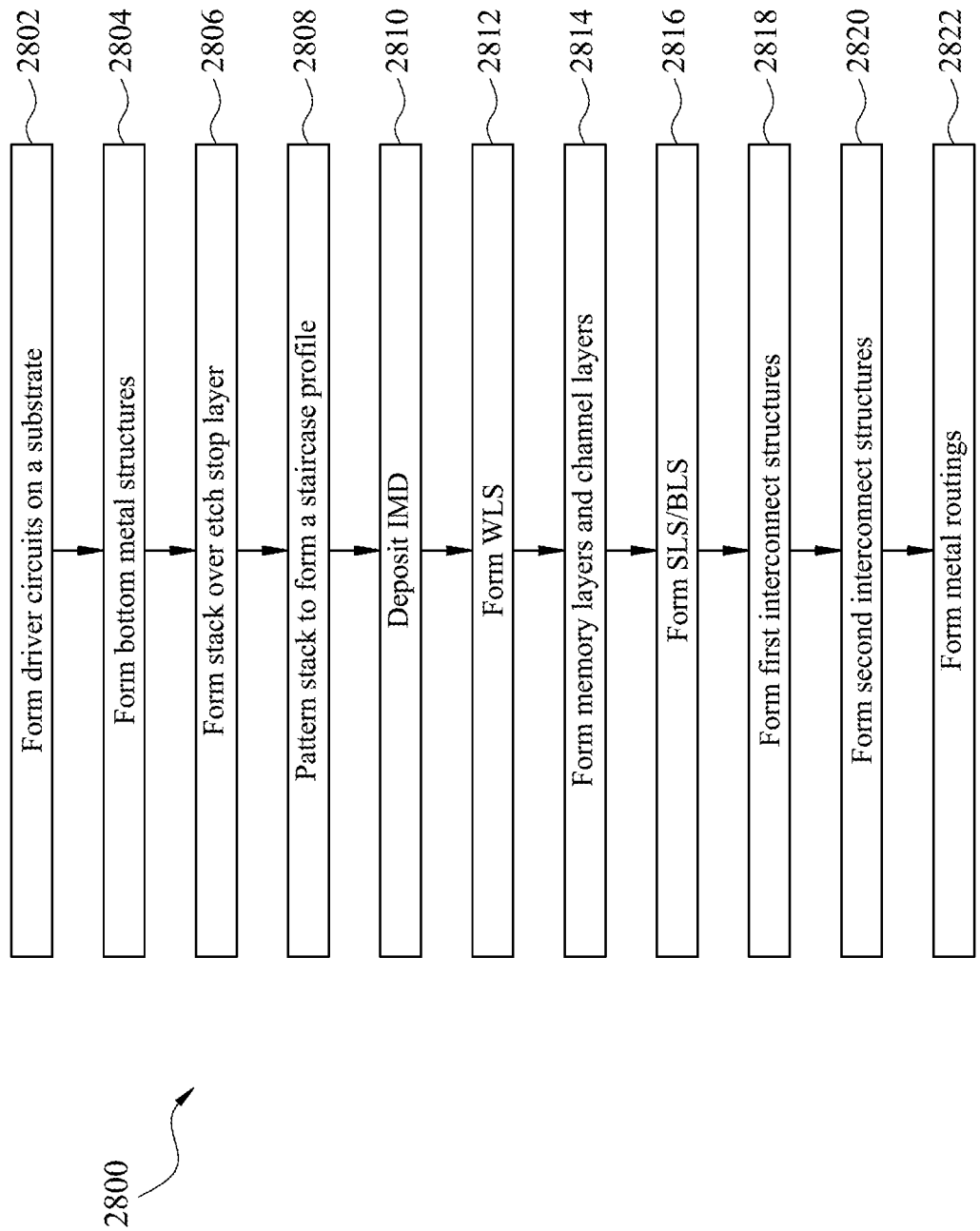
FIG. 28 illustrates a flow chart of an example method to make a three-dimensional memory device, in accordance with some embodiments.

FIG. 28 illustrates a flowchart of a method 2800 for fabricating a 3D memory device, according to one or more embodiments of the present disclosure. For example, at least some of the operations of the method 2800 can be used to form a memory device (e.g., 3D memory device 2900). It is noted that the method 2800 is merely an example, and is not intended to limit the present disclosure. Accordingly, it is understood that additional operations may be provided before, during, and after the method 2800 of FIG. 28, and that some other operations may only be briefly described herein.

In a brief overview, the method 2800 starts with operation 2802 of forming a plurality of driver circuits are formed on a substrate. The method 2800 proceeds to operation 2804 of forming bottom interconnect structures. The method 2800 proceeds to operation 2806 in of forming a stack over an etch stop layer. The method 2800 proceeds to operation 2808 of patterning the stack in a staircase profile. The method 2800 proceeds to operation 2810 of depositing an intermetal dielectric (IMD). The method 2800 proceeds to operation 2812 of forming a number of word lines (WLs). The method 2800 proceeds to operation 2814 of depositing a number of memory layers and a number of channel layers. The method 2800 proceeds to operation 2816 of forming a number of (source/select line) SLs and number of bit lines (BLs). The method 2800 proceeds to operation 2818 of forming a number of first interconnect structures (sometimes referred to as WL interconnect structures). The method 2800 proceeds to operation 2820 of forming second interconnect structures. The method 2800 proceeds to operation 2822 of forming a number of metal routings.

Figure 29:
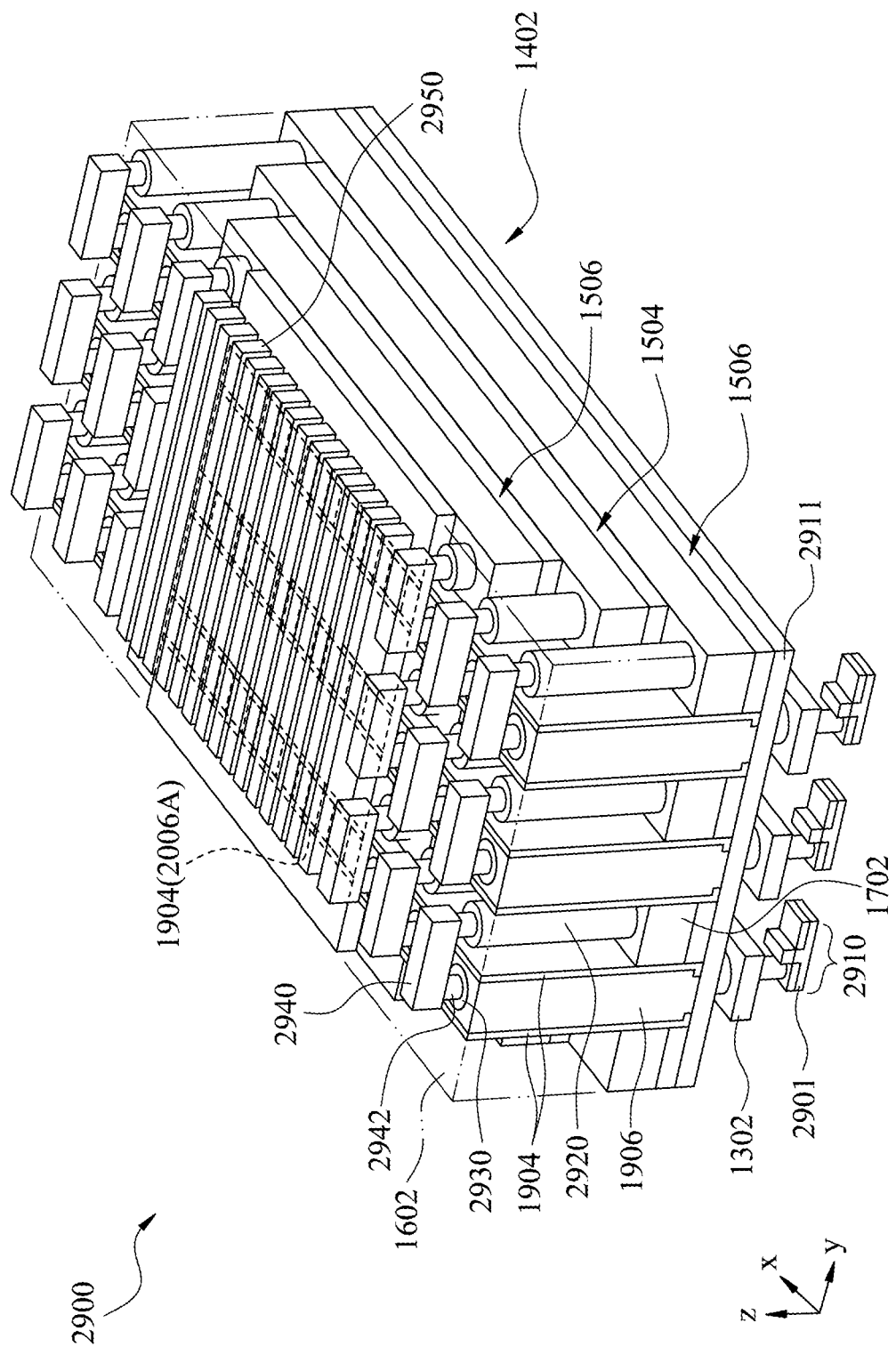

It is noted the operations 2804-2816 and 2820-2822 of FIG. 28 are substantially similar to the operations 1202-1218 of FIG. 8. Thus, the following discussions will be directed to the operations 2802 and 2820. FIGS. 29-30 each illustrate, in a perspective view and a cross-sectional view, respectively, the 3D memory device 2900 made by the method 2800. The 3D memory device 2900 is substantially similar to the 3D memory device test structure 1300, but includes driver circuits and a plurality of first interconnect structures coupled to WLs. In some embodiments, the 3D memory device 2900 is formed concurrently with the 3D memory device test structures 1300 in order to be tested by the 3D memory device test structures 1300. Although FIGS. 29-30 illustrate the 3D memory device 2900, it is understood the 3D memory device 2900 may include a number of other device such as inductors, fuses, capacitors, coils, etc., which are not shown in FIGS. 29-30 for the purposes of clarity.

In some embodiments, the method 2800 is substantially similar to the method 1200 of FIG. 12 except that the method 2800 further includes operations to form a plurality of driver circuits and a plurality of WL interconnect structures. In some embodiments, the method 2800 is used to form a memory block tested by the 3D memory device test structures formed by the method 1200. Thus, in the following discussions, operations of the method 2800 may be associated with the perspective view and cross-sectional view of FIGS. 29-30, respectively.

Corresponding to operations 2802-2822 of FIG. 28, FIGS. 29-30 are a perspective view and a cross-sectional view cut along the Y-direction, respectively, of the 3D memory device 2900, in accordance with various embodiments.

At operation 2802, a plurality of driver circuits 2910 are formed on a semiconductor substrate 2901 (substantially similar to the semiconductor substrate 1401 of FIG. 14). The semiconductor substrate 2901 may be a semiconductor substrate, such as a bulk semiconductor, a semiconductor-on-insulator (SOI) substrate, or the like, which may be doped (e.g., with a p-type or an n-type dopant) or undoped. The substrate 2901 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 2901 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof, or any other suitable material. The plurality of driver circuits 2910 may comprise a plurality of transistors. The transistors may be any suitable transistor such as a complementary metal-oxide semiconductor (CMOS), any other suitable metal-oxide-semiconductor field-effect transistor (MOSFET), any suitable field-effect transistor (FET), or any suitable bipolar junction transistor (BJT). The driver circuits are configured to control the plurality of transistors (e.g., regulate current flow or control components in the memory device).

At operation 2804 (and similar to operation 1202 of FIG. 8), the plurality of bottom interconnect structures 1302 may be formed on the plurality of driver circuits 2910. The bottom interconnect structures 1302 may comprise both a horizontal portion and a vertical portion and be configured to electrically couple to the driver circuits 2910 and the memory device 2800. The plurality of bottom interconnect structures 1302 may be formed concurrently in the memory device 2900 and the memory device test structures 1300.

At operation 2806, the stack 1402 is formed over an etch stop layer 2911. The etch stop layer 2911, formed in place of the substrate 1401 in the 3D memory device test structure 1300, can function as an etch stop layer in a subsequent etching process, and may comprise a suitable material such as silicon oxide, silicon nitride, silicon oxynitride, titanium, titanium nitride, combinations thereof, or any other suitable material, and may be formed by a suitable formation method such as CVD, PVD, any other suitable method, or combinations thereof. The etch stop layer 2911 is formed directly above bottom interconnect structures 1302 and extends in both the X-direction and the Y-direction. The etch stop layer 2911 substantially planar in both the X-direction and the Y-direction. The etch stop layer 2911 may have a thickness in the Y-direction in a range in between about 5 Angstroms and about 50 Angstroms, inclusive (e.g., 5, 15, 25, 35, 45, and 50 Angstroms) or any other suitable thickness.

At operation 2808 (e.g., similar to operation 1206 of FIG. 12), the stack 1402 is patterned to form a staircase profile and the first step 1502, the second step 1504, and the third step 1506. At 2810 (e.g., similar to operation 1208 of FIG. 12), the IMD 1602 is formed over the stack 1402. At 2812 (e.g., similar to operation 1210 of FIG. 12), the number of WLs 1702 are formed. At 2814 (e.g., similar to operation 1212 of FIG. 812), the memory layers 1902 and the channel layers 1904 are formed. The inner spacers 1906 are also formed. The channel layers 1904 are then patterned into channel segments. At 2816 (e.g., similar to operation 1214 of FIG. 12), the BLs 2002 and the SLs 2004 are formed. Each of the operations 2808-2816 may be formed concurrently with their respective similar operation from the method 800.

At operation 2818, a number of first interconnect structures 2920 (e.g., WL interconnect structures, WL vias) coupled to the WLs 1702 are formed. The first interconnect structures 2920 each penetrate through the IMD 1602 with a respective height (or depth) to land on a respective WL 1702. For example, in FIG. 29, a number of first interconnect structures 2920 vertically extend with a first height to land on the WLs 1702 at the first step 1502; a number of first interconnect structures 2920 vertically extends with a second height to land on the WLs 1702 at the second step 1504; and a number of first interconnect structures 2920 vertically extends with a third height to land on the WLs 1702 at the third step 1506.

The first interconnect structures 2920 are formed by etching the IMD 1602 to form a number of openings that expose various portions of the WLs 1702 at different steps, and then filled out with the openings with a metallic fill material. The metallic fill material includes at least one metal material such as, but not limited to, tungsten, copper, cobalt, ruthenium, titanium, tantalum, combinations thereof, or any other suitable material. The metallic fill material can be deposited by a conformal deposition method, which can be, for example, chemical vapor deposition (CVD), atomic layer deposition (ALD), electroless plating, electroplating, combinations thereof, or any other suitable method.

At operation 2820, (e.g., similar to operation 1216 of FIG. 12), a number of second interconnect structures 2930 (e.g., similar to the test interconnect structures 2100) are formed. In some embodiments, the number of second interconnect structures 2930 are formed at the same time as the test interconnect structures 2100 of operation 1216 of the 3D memory device test structure 1300. The second interconnect structures 2930 of the 3D memory device 2900 and the test interconnect structures 2100 of the 3D memory device test structure 1300 may be formed concurrently so as to mirror each other's profiles and dimensions. In some embodiments, the first interconnect structures 2920 are formed before the second interconnect structures 2930 and the test interconnect structures 2100.

At operation 2822 (e.g., similar to operation 1218 of FIG. 12), a first plurality of metal routings 2940 (similar to the metal routings 2200, 2400, and 2600) and top vias 2942 (similar to the top vias 2202, 2402, and 2602) are formed. A second plurality of metal routings 2950 connecting the BLs 2002 and the SLs 2004 are also formed. The second plurality of metal routings may be made from the same materials and methods as the first plurality of metal routings 2940.

In one aspect of the present disclosure, a memory device is disclosed. A memory device includes a first memory block. The first memory block includes a first memory sub-array and a first interface portion disposed next to the first memory sub-array. The first interface portion has a plurality of first control structures formed as a first staircase profile. The first memory block further includes a plurality of first interconnect structures landing on a corresponding one of the plurality of first control structures, and a plurality of second interconnect structures laterally spaced apart from the first staircase profile. The plurality of second interconnect structures are configured to electrically couple a corresponding one of the plurality of first interconnect structures to a first transistor. The memory device further includes a first test structure disposed next to the first memory block and a second test structure disposed next to the first memory block, each configured to simulate electrical connections of the plurality of second interconnect structures. The first and second test structures are electrically coupled to each other and are each electrically isolated form the first memory block.

In another aspect of the present disclosure, a memory device is disclosed. The memory device includes a plurality of memory sub-arrays, wherein each of the memory sub-arrays is accessed through a plurality of word lines (WLs). Each of the plurality of WLs is coupled to a WL driver through a corresponding one of a plurality of interconnect structures that are laterally spaced from the staircase. The memory device further comprises a plurality of test structures. Each of the test structures corresponds to one of the memory sub-arrays, and comprises a plurality of test interconnect structures that emulate interconnect structures, respectively. The plurality of test structures are electrically coupled to one another in series.

In yet another aspect of the present disclosure, a method for testing a memory device is disclosed. The method includes forming a plurality of test structures. Each of the test structures is physically disposed next to but electrically isolated from a corresponding one of the memory sub-arrays. Each of the test structures is configured to emulate a plurality of interconnect structures that electrically couples a plurality of word lines (WLs) of the corresponding memory sub-array, formed as a staircase, to a driver circuit. The interconnect structures are lterally spaced from the staircase. The method further includes coupling the test structures in series and determining whether a level of current conducting through the serially connected test structure satisfies a condition. The method further includes testing, based on the determination, one of the test structures by bypassing the rest of the test structures at a time so as to identify electrical connection issues in one or more of the memory sub-arrays.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a first memory block comprising:
a first memory sub-array;
a first interface portion disposed next to the first memory sub-array, the first interface portion having a plurality of first control structures formed as a first staircase profile;
a plurality of first interconnect structures landing on a corresponding one of the plurality of first control structures; and
a plurality of second interconnect structures, each of the plurality of second interconnect structures laterally spaced apart from the first staircase profile but configured to electrically couple a corresponding one of the plurality of first interconnect structures to a first transistor;
a first test structure disposed next to the first memory block, the first test structure configured to simulate electrical connections of the plurality of second interconnect structures; and
a second test structure disposed next to the first memory block, the second test structure configured to simulate electrical connections of the plurality of second interconnect structures;
wherein the first and second test structures are electrically coupled to each other, and are each electrically isolated from the first memory block.

2. The memory device of claim 1, wherein each of the first and second test structures comprises a plurality of vertical test interconnect structures that emulate profiles of the plurality of second interconnect structures, respectively.

3. The memory device of claim 2, wherein the plurality of vertical test interconnect structures of the first and second test structures are electrically coupled to one another in series.

4. The memory device of claim 2, wherein the plurality of vertical test interconnect structures each extend through the corresponding first or second test structure.

5. The memory device of claim 2, wherein the plurality of vertical test interconnect structures share a same height.

6. The memory device of claim 2, wherein each of the first and second test structures comprises a plurality of first lateral test interconnect structures and a plurality of second lateral test interconnect structures disposed below and above the first or second test structure, respectively, and wherein each of the plurality of vertical test interconnect structures is connected to a corresponding one of the plurality of first lateral test interconnect structures and a corresponding one of the plurality of second lateral test interconnect structures on its ends, respectively.

7. The memory device of claim 1, wherein the first transistor that functions as a first driver circuit is disposed below the first memory block.

8. The memory device of claim 1, further comprising:
a second memory block that comprises:
  a second memory sub-array;
  a second interface portion disposed next to the second memory sub-array, the second interface portion having a plurality of second control structures formed as a second staircase profile; and
  a plurality of third interconnect structures landing on a corresponding one of the plurality of second control structures; and
  a plurality of fourth interconnect structures, each of the plurality of fourth interconnect structures laterally spaced apart from the second staircase profile but configured to electrically couple a corresponding one of the plurality of third interconnect structures to a second transistor, wherein the second transistor that functions a second driver circuit is disposed below the second memory block;
a third test structure disposed next to the second memory block, the third test structure configured to simulate electrical connections of the plurality of fourth interconnect structures; and
a fourth test structure disposed next to the second memory block, the fourth test structure configured to simulate electrical connections of the plurality of fourth interconnect structures,
wherein the third and fourth test structures are electrically coupled to each other, and are each electrically isolated from the second memory block.

9. The memory device of claim 8, wherein the first through fourth test structures are electrically coupled to one another in series.

10. The memory device of claim 8, further comprising:
a first switch electrically coupled between (i) one of the first or second test structure and (ii) one of the third or fourth test structure; and
a second switch configured to bypass the first and second test structures.

11. The memory device of claim 10, the first and second switches are alternately activated so as to selectively bypass the first and second test structures.

12. A memory device, comprising:
a plurality of memory sub-arrays, wherein each of the plurality of memory sub-arrays is accessed through a plurality of word lines (WLs) that form a staircase, wherein each of the plurality of WLs is coupled to a WL driver through a corresponding one of a plurality of interconnect structures that are laterally spaced from the staircase; and
a plurality of test structures, wherein each of the plurality of test structures corresponds to one of the plurality of memory sub-arrays, and comprises a plurality of test interconnect structures that emulate the interconnect structures, respectively;
wherein the plurality of test interconnect structures each vertically extend through the corresponding test structure, and are coupled to one another through a first plurality of horizontally extending interconnect structures and a second plurality of horizontally extending interconnect structures, and wherein the plurality of test structures are electrically coupled to one another in series.

13. The memory device of claim 12, further comprising:
a plurality of first switches, wherein each of the plurality of first switches is selected to electrically couple a first one of the plurality of test structures disposed next to a first one of the plurality of memory sub-arrays to a second one of the plurality of test structures disposed next to a second one of the plurality of memory sub-arrays; and
a plurality of second switches, wherein each of the plurality of second switches is selected to bypass a corresponding one of the plurality of test structures.

14. The memory device of claim 12, wherein each of the plurality of test structures is electrically isolated from the corresponding memory sub-array.

15. The memory device of claim 12, wherein the plurality of test interconnect structures of each test structure share a same height.

16. The memory device of claim 12, wherein the first plurality of horizontally extending interconnect structures and the second plurality of horizontally extending interconnect structures are disposed along a top surface and a bottom surface of the corresponding test structure, respectively.

17. A memory device, comprising:
a first memory block comprising:
  a first memory sub-array;
  a first interface portion disposed next to the first memory sub-array, the first interface portion having a plurality of first control structures formed as a first staircase profile;
  a plurality of first interconnect structures landing on a corresponding one of the plurality of first control structures; and
  a plurality of second interconnect structures, each of the plurality of second interconnect structures laterally spaced apart from the first staircase profile but configured to electrically couple a corresponding one of the plurality of first interconnect structures to a first transistor;
a first test structure disposed next to the first memory block, the first test structure configured to simulate electrical connections of the plurality of second interconnect structures; and
a second test structure disposed next to the first memory block, the second test structure configured to simulate electrical connections of the plurality of second interconnect structures;
wherein the first and second test structures are electrically coupled to each other, and are each electrically isolated from the first memory block;
wherein each of the first and second test structures comprises a plurality of vertical test interconnect structures that emulate profiles of the plurality of second interconnect structures, respectively.

18. The memory device of claim 17, wherein the plurality of vertical test interconnect structures of the first and second test structures are electrically coupled to one another in series.

19. The memory device of claim 17, wherein each of the first and second test structures comprises a plurality of first lateral test interconnect structures and a plurality of second lateral test interconnect structures disposed below and above the first or second test structure, respectively, and wherein each of the plurality of vertical test interconnect structures is connected to a corresponding one of the plurality of first lateral test interconnect structures and a corresponding one of the plurality of second lateral test interconnect structures on its ends, respectively.

20. The memory device of claim of claim 12, wherein the plurality of test structures comprise a respective pair of test structures disposed next to the one of the plurality of memory sub-arrays, the respective pair of test structures comprising a first test structure and a second test structure that emulate the plurality of test interconnect structures.

* * * * *